United States Patent
Song et al.

(10) Patent No.: US 11,650,347 B2
(45) Date of Patent: May 16, 2023

(54) FAST MEASUREMENT AND INTERPRETATION OF DOWNHOLE MULTI-DIMENSIONAL MEASUREMENT

(71) Applicant: Schlumberger Technology Corporation, Sugar Land, TX (US)

(72) Inventors: Yi-Qiao Song, Newton Center, MA (US); Ravinath Kausik Kadayam Viswanathan, Sharon, MA (US); Martin Hurlimann, Newton, MA (US); Vivek Anand, Sugar Land, TX (US); Albina Mutina, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 310 days.

(21) Appl. No.: 16/615,422

(22) PCT Filed: May 23, 2018

(86) PCT No.: PCT/US2018/034052
§ 371 (c)(1),
(2) Date: Nov. 21, 2019

(87) PCT Pub. No.: WO2018/217847
PCT Pub. Date: Nov. 29, 2018

(65) Prior Publication Data
US 2020/0174153 A1 Jun. 4, 2020

Related U.S. Application Data

(60) Provisional application No. 62/510,746, filed on May 24, 2017.

(51) Int. Cl.
*G01V 3/32* (2006.01)
*G01N 24/08* (2006.01)
(Continued)

(52) U.S. Cl.
CPC ............. *G01V 3/32* (2013.01); *G01N 24/081* (2013.01); *G01R 33/5608* (2013.01); *G01R 33/448* (2013.01)

(58) Field of Classification Search
CPC ...... G01V 3/32; G01N 24/081; G01R 33/448; G01R 33/3808; G01R 33/5608; G01R 33/546
See application file for complete search history.

(56) References Cited

U.S. PATENT DOCUMENTS

| 4,933,638 A | 6/1990 | Kleinberg et al. |
| 5,204,627 A | 4/1993 | Mistretta et al. |
| (Continued) | | |

FOREIGN PATENT DOCUMENTS

| DE | 102011105394 A1 | 3/2012 |
| GN | 102859394 A | 1/2013 |
| GN | 103163497 A | 6/2013 |

OTHER PUBLICATIONS

International Search Report and Written Opinion issued in the related PCT Application PCT/US2018/034052, dated Jul. 31, 2018 (10 pages).

(Continued)

*Primary Examiner* — Rishi R Patel

(57) ABSTRACT

Downhole properties of a geological formation may be determined using nuclear magnetic resonance (NMR) measurements obtained by a moving tool. To do so, an interpretation of the NMR data obtained by the moving data may take into account a moving model, characterization, or calibration of the downhole NMR tool. Additionally or alternatively, a partial interpretation mask may exclude interpretation of certain areas of data (e.g., T1-T2 data points or diffusion-T2 data points) that are expected to be less likely to describe downhole materials of interest.

16 Claims, 15 Drawing Sheets

(51) Int. Cl.
  *G01R 33/56* (2006.01)
  *G01R 33/44* (2006.01)

(56) References Cited

U.S. PATENT DOCUMENTS

| | | | |
|---|---|---|---|
| 6,459,262 | B1 | 10/2002 | Wisler et al. |
| 9,702,953 | B1* | 7/2017 | Xiao .................. G01R 33/56 |
| 2004/0135579 | A1 | 7/2004 | Takizawa et al. |
| 2015/0346378 | A1* | 12/2015 | Kadayam Viswanathan ............... G01V 3/32 702/6 |
| 2016/0018489 | A1* | 1/2016 | Farivar-Mohseni ......................... G01R 33/34007 600/422 |
| 2016/0109613 | A1 | 4/2016 | Paulsen et al. |

OTHER PUBLICATIONS

Song, Y.-Q., Venkataramanan, L., Hürlimann, M. D., Flaum, M., Frulla, P., & Straley, C. (2002). T1-T2 Correlation Spectra Obtained Using a Fast Two-Dimensional Laplace Inversion. Journal of Magnetic Resonance, 154(2), 261-268.

Hürlimann, M. D., Venkataramanan, L., & Flaum, C. (2002). The diffusion-spin relaxation time distribution function as an experimental probe to characterize fluid mixtures in porous media. The Journal of Chemical Physics, 117, (11 pages).

Song, Y.-Q. (2013). Magnetic Resonance of Porous Media (MRPM): A perspective. Journal of Magnetic Resonance, 229, 12-24.

Bloembergen, N., Purcell, E.M.; Pound, R.V. "Relaxation Effects in Nuclear Magnetic Resonance Absorption" Phys. Rev. 1948, 73, (37 pages).

Kausik, R., Cao Minh, C., Zielinski., L., Vissapragada, B., Akkurt, R., Song, Y.-Q., Liu, C., Jones, S., and Blair, E., 2011, Characterization of gas dynamics in kerogen nanopores by NMR, Paper SPE-147198, presented at the SPE Annual Technical Conference and Exhibition, Denver, Colorado, USA, Oct. 30-Nov. 2, 2011. (16 pages).

Kausik, R., Fellah, K., Rylander, E., Singer, M.P., Lewis, R.E., Sinclair, S.M., 2014, NMR relaxometry in shale and mplications for logging, Petrophysics, vol. 57, No. 4 (Aug. 2016); p. 339-350.

Hubbard., 1963, Theory of Nuclear Magnetic Relaxation by Spin-Rotational Interactions in Liquids, Physical Review, vol. 131, No. 3, Aug. 1, 1963, pp. 1155-1165.

Papaioannou et al, 2015, Methane Storage in Nanoporous Media as Observed via High-Field NMR Relaxometry, Physical Review Applied, vol. 4, No. 2, pp. 024018-11.

Kimmich et al 2002, Strange kinetics, porous media, and NMR, Chemical Physics, 284(1-2), 253-285.

International Preliminary Report on Patentability issued in the related PCT Application PCT/US2018/034052, dated Dec. 5, 2019 (9 pages).

First Chinese Office Action issued in the related Chinese Patent Application No. 201880037419.0 dated Sep. 8, 2021, 33 pages with English translation.

* cited by examiner

FAST MEASUREMENT AND INTERPRETATION OF DOWNHOLE MULTI-DIMENSIONAL MEASUREMENT

CROSS-REFERENCE TO RELATED APPLICATIONS

This application claims priority to U.S. Provisional Patent Application No. 62/510,746, which was filed on May 24, 2017, the entirety of which is incorporated by reference herein.

BACKGROUND

This disclosure relates to quickly obtaining and interpreting downhole multi-dimensional nuclear magnetic resonance (NMR) measurements in a geological formation.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as an admission of any kind.

Producing hydrocarbons from a wellbore drilled into a geological formation is a remarkably complex endeavor. In many cases, decisions involved in hydrocarbon exploration and production may be informed by measurements from downhole well-logging tools that are conveyed deep into the wellbore. The measurements may be used to infer properties and characteristics of the geological formation surrounding the wellbore.

One type of downhole well-logging tool uses nuclear magnetic resonance (NMR) to measure the response of nuclear spins in formation fluids to applied magnetic fields. Many NMR tools have a permanent magnet that produces a static magnetic field at a desired test location (e.g., where the fluid is located). The static magnetic field produces an equilibrium magnetization in the fluid that is aligned with a magnetization vector along the direction of the static magnetic field. A transmitter antenna produces a time-dependent radio frequency magnetic field that is perpendicular to the direction of the static field. The radio frequency magnetic field produces a torque on the magnetization vector that causes it to rotate about the axis of the applied radio frequency magnetic field. The rotation results in the magnetization vector developing a component perpendicular to the direction of the static magnetic field. This causes the magnetization vector to align with the component perpendicular to the direction of the static magnetic field, and to precess around the static field.

The time for the magnetization vector to re-align with the static magnetic field is known as the longitudinal magnetization recovery time, or "T1 relaxation time." The spins of adjacent atoms precess in tandem synchronization with one another due to the precession of the magnetization vector. The time for the precession of the spins of adjacent atoms to break synchronization is known as the transverse magnetization decay time, or "T2 relaxation time." Thus, the measurements obtained by downhole NMR tools may include distributions of the first relaxation time T1, the second relaxation time T2, or molecular diffusion (D), or a combination of these. For example, a downhole NMR tool may measure just T2 distribution, or the tool may measure a joint T1-T2 distribution or T1-T2-D distribution.

Any movement of the downhole tool in the wellbore could affect the accuracy of the measurements. To improve the accuracy of the measurements, the downhole NMR tool may be moved to fixed stations or may be moved relatively slowly through the wellbore. Yet the slower the downhole NMR tool moves through the wellbore, the longer it will take to complete the measurement. Therefore, there may be an undesirable tradeoff in deciding whether to obtain a downhole NMR measurement that is faster but less accurate, or more accurate but slower. Indeed, many implementations of this measurement may be very slow and the resulting logging speed may be quite low, such as slower than 300 ft/hr.

SUMMARY

A summary of certain embodiments disclosed herein is set forth below. These aspects are presented merely to provide the reader with a summary of these certain embodiments and that these aspects are not intended to limit the scope of this disclosure. Indeed, this disclosure may encompass a variety of aspects that may not be set forth below.

To more quickly perform downhole NMR measurements, the present disclosure describes NMR systems and methods that may allow interpretation of NMR measurement obtained by a moving, rather than stationary, downhole NMR tool. To do so, an interpretation of the NMR data obtained by the moving data may take into account a moving model, characterization, or calibration of the downhole NMR tool. Additionally or alternatively, a partial interpretation mask may exclude interpretation of certain areas of data (e.g., T1-T2 data points or diffusion-T2 data points) that are expected to be less likely to describe downhole materials of interest.

Various refinements of the features noted above may be undertaken in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are examples of the presently disclosed techniques. Additionally, in an effort to provide a concise description of these embodiments, certain features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would still be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, references to "one embodiment" or "an embodiment" of the present disclosure are not intended to be interpreted as excluding the existence of additional embodiments that also incorporate the recited features.

This disclosure describes systems and methods that may be used to more quickly log and interpret measurements obtained by a downhole nuclear magnetic resonance (NMR) tool. In particular, multi-dimensional NMR measurements, such as two-dimensional NMR measurements, (and/or, in some cases, one or more well-logging measurements relating to total organic carbon) may be used to estimate a variety of formation properties, such as downhole fluid volumes of bitumen, light hydrocarbon, kerogen, and water, and/or reservoir producibility index (RPI), among other things. To more quickly perform downhole NMR measurements, this disclosure describes NMR systems and methods that may allow interpretation of NMR measurement obtained by a moving, rather than stationary, downhole NMR tool. To do so, an interpretation of the NMR data obtained by the moving data may take into account a moving model, characterization, or calibration of the downhole NMR tool. Additionally or alternatively, a partial interpretation mask may exclude interpretation of certain areas of data (e.g., T1-T2 data points or diffusion-T2 data points) that are expected to be less likely to describe downhole materials of interest.

Figure 1:
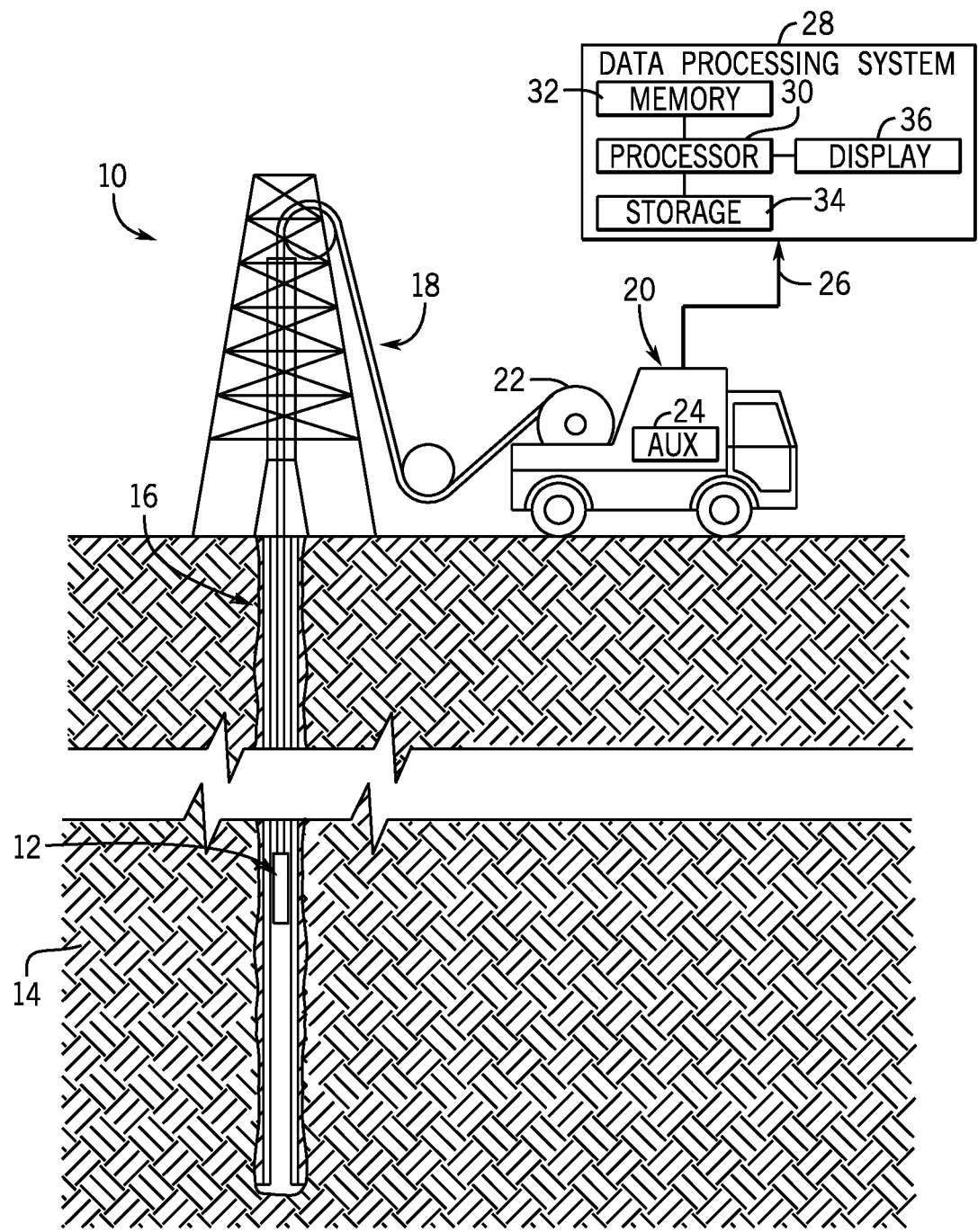
FIG. 1 is a schematic diagram of a well-logging system that may quickly obtain and/or interpret nuclear magnetic resonance (NMR) logging measurements, in accordance with an embodiment.

With this in mind, FIG. 1 illustrates a well-logging system 10 that may employ the systems and methods of this disclosure. The well-logging system 10 may be used to convey a downhole tool 12 through a geological formation 14 via a wellbore 16. The downhole tool 12 may be conveyed on a cable 18 via a logging winch system 20. Although the logging winch system 20 is schematically shown in FIG. 1 as a mobile logging winch system carried by a truck, the logging winch system 20 may be substantially fixed (e.g., a long-term installation that is substantially permanent or modular). Any suitable cable 18 for well logging may be used. The cable 18 may be spooled and unspooled on a drum 22 and an auxiliary power source 24 may provide energy to the logging winch system 20 and/or the downhole tool 12.

Moreover, although the downhole tool 12 is described as a wireline downhole tool, it should be appreciated that any suitable conveyance may be used. For example, the downhole tool 12 may instead be conveyed as a logging-while-drilling (LWD) tool as part of a bottom hole assembly (BHA) of a drill string, conveyed on a slickline or via coiled tubing, and so forth. For the purposes of this disclosure, the downhole tool 12 (e.g., downhole NMR tool 12) may be any suitable measurement tool that obtains NMR logging measurements through depths of the wellbore 16.

Many types of downhole tools may obtain NMR logging measurements in the wellbore 16. These include, for example, nuclear magnetic resonance (NMR) tools such as the Combinable Magnetic Resonance (CMR) tool, the Magnetic Resonance Scanner (MRX) tool, and the ProVISION tool by Schlumberger Technology Corporation. In general, NMR tools may have a permanent magnet that produces a static magnetic field at a desired test location (e.g., where the fluid is located). The static magnetic field produces an equilibrium magnetization in the fluid that is aligned with a magnetization vector along the direction of the static magnetic field. A transmitter antenna produces a time-dependent radio frequency magnetic field that is perpendicular to the direction of the static field. The radio frequency magnetic field produces a torque on the magnetization vector that causes it to rotate about the axis of the applied radio frequency magnetic field. The rotation results in the magnetization vector developing a component perpendicular to the direction of the static magnetic field. This causes the magnetization vector to align with the component perpendicular to the direction of the static magnetic field, and to precess around the static field.

The time for the magnetization vector to re-align with the static magnetic field is known as the longitudinal magnetization recovery time, or "T1 relaxation time." The spins of adjacent atoms precess in tandem synchronization with one another due to the precession of the magnetization vector. The time for the precession of the spins of adjacent atoms to break synchronization is known as the transverse magnetization decay time, or "T2 relaxation time." Thus, the measurements obtained by the downhole tool 12 may include distributions of the first relaxation time T1, the second relaxation time T2, or molecular diffusion D, or a combination of these. For example, a downhole NMR tube 12 may measure just T2 distribution, or the downhole NMR tool 12 may measure a joint T1-T2 distribution or T1-T2-D distribution.

For each depth of the wellbore 16 that is measured, a downhole NMR tool 12 may generate NMR logging measurements that include a distribution of amplitudes of T2 relaxation time, T1 relaxation time, diffusion, or a combination thereof. This list is intended to present certain examples and is not intended to be exhaustive. Indeed, any suitable downhole tool 12 that obtains NMR logging measurements may benefit from the systems and methods of this disclosure.

The downhole tool 12 may provide logging measurements 26 to a data processing system 28 via any suitable telemetry (e.g., via electrical signals pulsed through the geological formation 14 or via mud pulse telemetry). The data processing system 28 may process the NMR logging measurements 26 to identify patterns in the NMR logging measurements 26. The patterns in the NMR logging measurements 26 may indicate certain properties of the wellbore 16 (e.g., viscosity, porosity, permeability, relative proportions of water and hydrocarbons, and so forth) that might otherwise be indiscernible by a human operator.

To this end, the data processing system 28 thus may be any electronic data processing system that can be used to carry out the systems and methods of this disclosure. For example, the data processing system 28 may include a processor 30, which may execute instructions stored in memory 32 and/or storage 34. As such, the memory 32 and/or the storage 34 of the data processing system 28 may be any suitable article of manufacture that can store the instructions. The memory 32 and/or the storage 34 may be ROM memory, random-access memory (RAM), flash memory, an optical storage medium, or a hard disk drive, to name a few examples. A display 36, which may be any suitable electronic display, may provide a visualization, a well log, or other indication of properties in the geological formation 14 or the wellbore 16 using the NMR logging measurements 26.

Figure 2:
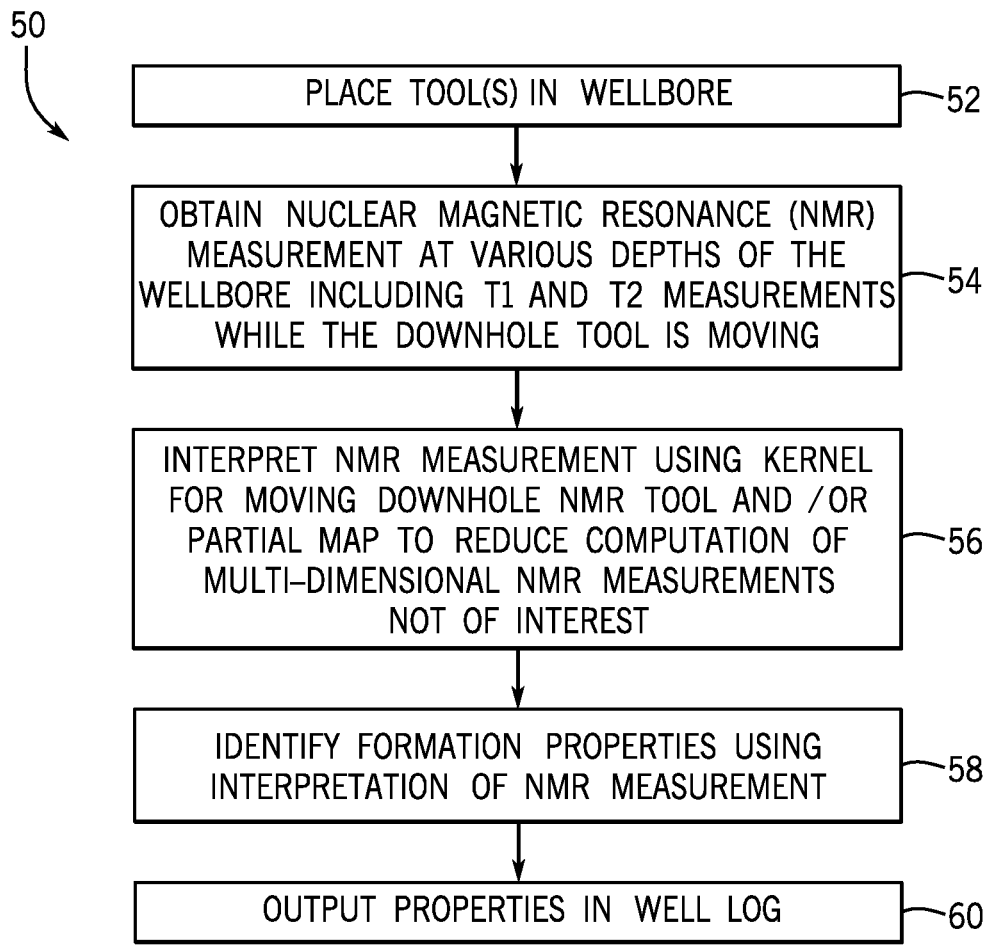
FIG. 2 is a flowchart of a method for using the system of FIG. 1, in accordance with an embodiment.

A flowchart 50 of FIG. 2 describes one way to quickly estimate downhole fluid volumes from NMR measurements, even in shale reservoirs. Namely, the downhole NMR tool 12 may be placed in the wellbore 16 (block 52) and a multi-dimensional NMR measurement (e.g., T1, T2, and/or diffusion (D) measurement) of the wellbore 16 may be obtained (block 54) while the downhole NMR tool 12 is moving. The data processing system 28 may interpret the multi-dimensional NMR measurement using a kernel based on a characterization of a moving downhole NMR tool and/or using a partial multi-dimensional NMR map to reduce computation of multi-dimensional NMR measurements not of interest (block 56). Using any suitable technique, formation properties may be identified using the interpretation of the NMR measurement (block 58). The identified formation properties may be output onto a well log (block 60), which may enable decision makers to make production and recovery decisions tailored to the conditions of the geological formation 14.

A discussion of the NMR measurement will follow. Hydrocarbon liquids generally encountered in the oilfield undergo NMR relaxation primarily via dipolar coupling between the $^1$H spin nuclei. Other mechanisms include interactions between the spin-bearing nuclei with the unpaired electrons, which can become the dominant effect given the much larger magnetic moment of the electrons. The common source of such electron spins are paramagnetic ions or free radicals found in the crude oils or in the confining rock minerals. Methane natural gas undergoes relaxation in its bulk state by the mechanism of spin rotation. The NMR relaxation times of the liquid hydrocarbons can be split into different additive rates given as:

$$\frac{1}{T_{1,2}} = \frac{1}{T_{1,2}^{intra}} + \frac{1}{T_{1,2}^{inter}} + \frac{1}{T_{1,2}^{elec}} \tag{1}$$

The intra-molecular interaction $T_i^{intra}$ is due to interaction with other nuclear spins in the same molecule, or due to local rotational motions, inter-molecular relaxation $T_i^{inter}$ is due to interactions between spins in different molecules and $T_i^{elec}$ due to dipolar interactions of the nuclear spins with the unpaired electrons. To better understand the sensitivity of the relaxation to molecular motion, $T_1$ and $T_2$ can be written as a function of their spectral densities. The relaxation times for homonuclear interactions are given as:

$$T_1(\omega)^{-1} = \left(\frac{\mu_0}{4\pi}\right)^2 \gamma^4 \hbar^2 I(I+1)(5r^6)^{-1}[J(\omega) + 4J(2\omega)] \tag{2}$$

$$T_2(\omega)^{-1} = \left(\frac{\mu_0}{4\pi}\right)^2 \gamma^4 \hbar^2 I(I+1)(5r^6)^{-1}[3J(0) + 5J(\omega) + 2J(2\omega)] \tag{3}$$

where $\mu_0$ is the vacuum permeability, I is the spin number (I=1/2 for protons nuclei), $\gamma$ is the gyromagnetic ratio, h is planks constant over $2\pi$, and r is the inter-nuclear distance. The spectral densities $I(\omega)$ can be obtained by the Fourier transform of the autocorrelation function $G(t)=<B(\tau)B(\tau+t)>$ which describes the time dependent fluctuations of the local magnetic field B(t). The T2 relaxation times are dominated by the $I(\omega=0)$ term and are therefore very sensitive to the low frequency or slow motions. The $T_1$ relaxation times are sensitive to the much higher Larmor frequency ($\omega$ and $2\omega$), and therefore to the applied magnetic field ($B_0$). The longitudinal relaxation time obtained in the limit of very low Larmor frequencies, $T_1(\omega\tau\ll1)$, becomes proportional to $T_2(\omega)$ due to the dominance of the $I(\omega)$ term. Therefore, the $T_1$-$T_2$ map is sensitive to molecular motions in the frequency range between the Larmor frequency of the measurement and the very low frequencies. This shows the significance of using the $T_1/T_2$ ratio as the parameter to reflect molecular mobility in fluids, both in their bulk state or under confinement. A universal $T_1$-$T_2$ map for all the different constituents of gas and tight oil shale at 2 MHz Larmor frequency is summarized in FIG. 3.

Figure 3:
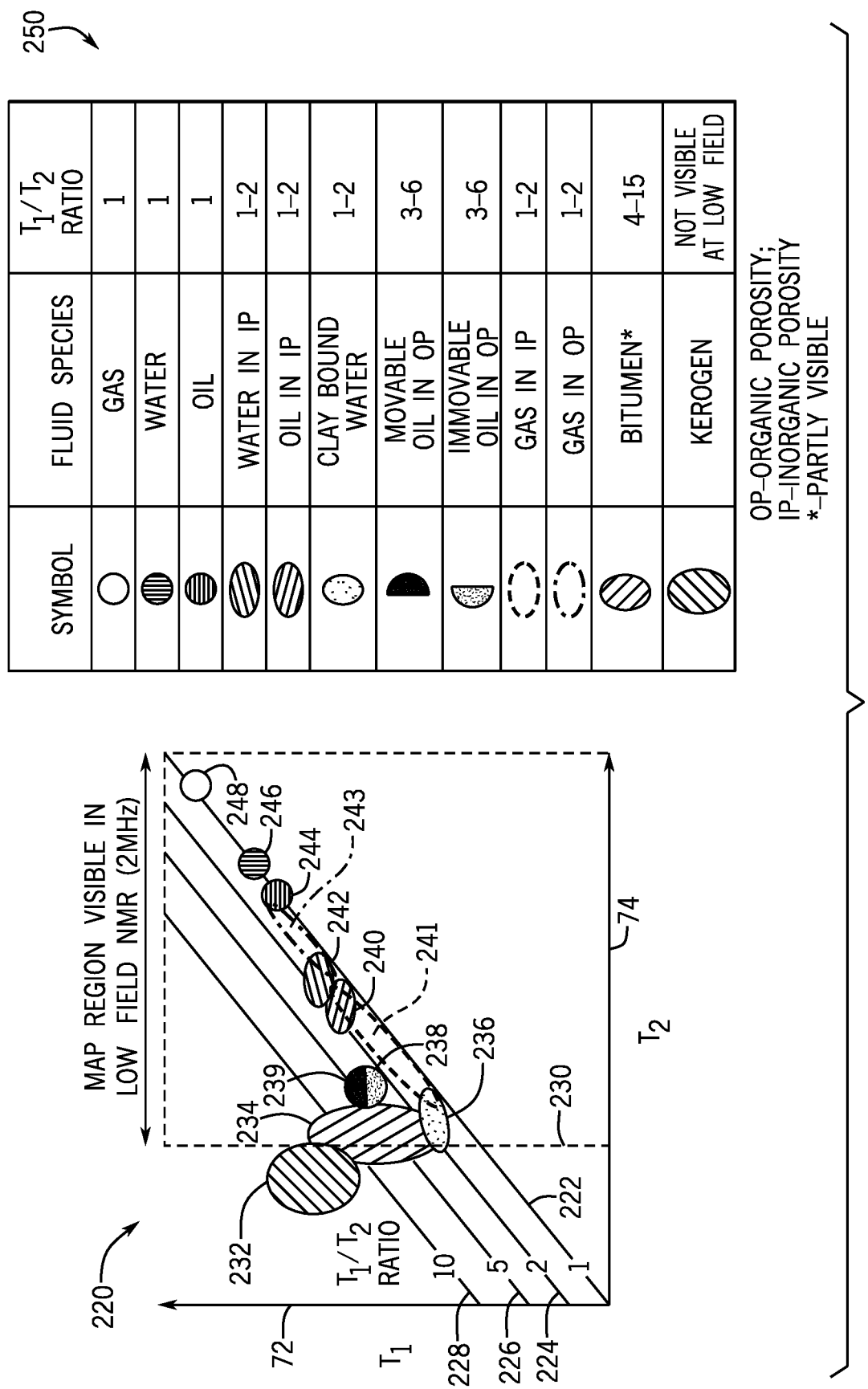
FIG. 3 is a T1-T2 map of different pore fluids and a table showing corresponding T1/T2 ratios for the different pore fluids, in accordance with an embodiment.

Different materials may appear in different locations on a multidimensional NMR map, such as a T1-T2 map. FIG. 3 shows a variety of different types of materials that could be classified based on their location in a T1-T2 map 220. The T1-T2 map 220 illustrates synthetic NMR measurements of T1 relaxation time (ordinate 72) and T2 relaxation time (abscissa 74) each on a logarithmic scale. The T1-T2 map 220 includes lines that represent different T1/T2 ratios across the T1-T2 map 220. In particular, the T1-T2 map 220 shown in FIG. 10 includes a line 222 illustrating a T1/T2 ratio of 1, a line 224 illustrating a T1/T2 ratio of 2, a line 226 illustrating a T1/T2 ratio of 5, and a line 228 illustrating a T1/T2 ratio of 10. The appearance of NMR measurements along different T1/T2 ratios, and thus across the lines 222, 224, 226, and 228, may be one way to identify the type of pore fluid that has been detected in the NMR measurements. In addition, certain pore fluids may be visible in low field NMR (at values of T2 higher than a threshold 230, which may be, in some examples, signals greater than about 2 MHz).

The different pore fluids located on the T1-T2 map 220 include kerogen 232, bitumen 234, clay-bound water 236, immovable oil in organic porosity (OP) 238, movable oil in organic porosity (OP) 239, oil in inorganic porosity (IP) 240, gas in organic porosity (OP) 241, water in inorganic porosity (IP) 242, gas in inorganic porosity (OP) 243, oil 244, water 246, and gas 248. The corresponding T1/T2 ratio is shown in a table 250. The T1/T2 ratios of bulk fluids or fluids in large pores are close to 1. As pore sizes become smaller, T2 becomes shorter and T1/T2 ratio becomes higher. The T1/T2 ratio of hydrocarbon is higher than that of water. Therefore, for tight oil reservoirs, water and oil signals can potentially be separated with proper T2 and T1/T2 ratio based identifications. These may be done in the manner discussed above or using any other suitable techniques.

Multi-Dimensional NMR in Shale Gas Formations

The natural gas (predominantly methane) molecules in the bulk state relax mainly via the spin rotation mechanism and have $T_1 = T_2$ and are given by:

$$\frac{1}{T_1} = \frac{1}{T_2} = \frac{2(C_\parallel^2 + 2C_\perp^2)I_1 \tau_F}{3\hbar^2} kT \quad (4)$$

where $\tau_F$ is the correlation time of rotation, k is the Boltzmann's constant, $I_1$ is the moment of inertia of the spherical molecule, T is the temperature, $C_\parallel$ and $C_\perp$ are the principle components (parallel and perpendicular) of the spin rotation tensor. The correlation time $\tau_F$ is inversely proportional to the viscosity of the fluid. It has also recently been shown that the spin rotation mechanism continues to dominate relaxation of bulk methane gas, even up to 10,000 psi (density of 0.307 g/cm$^3$).

The natural gas in gas shales is predominantly hosted in the organic kerogen pores in the form of free and adsorbed gas. The sizes of these pores are typically in the nano- to micrometer range, resulting in high surface-to-volume ratios, and therefore increased interaction between the gas molecules and pore surfaces. The adsorbed gas molecules typically have long residence times on the pore surfaces, resulting in enhanced relaxation due to mechanisms such as reorientations mediated by translational diffusion (RMTD). Additionally, intermolecular dipolar interactions between the adsorbed phase and nuclei in organic kerogen would lead to additional relaxation. The free and adsorbed gas molecules undergo fast exchange in comparison to the NMR $T_2$ relaxation times, resulting in one single relaxation distribution.

Figure 4:
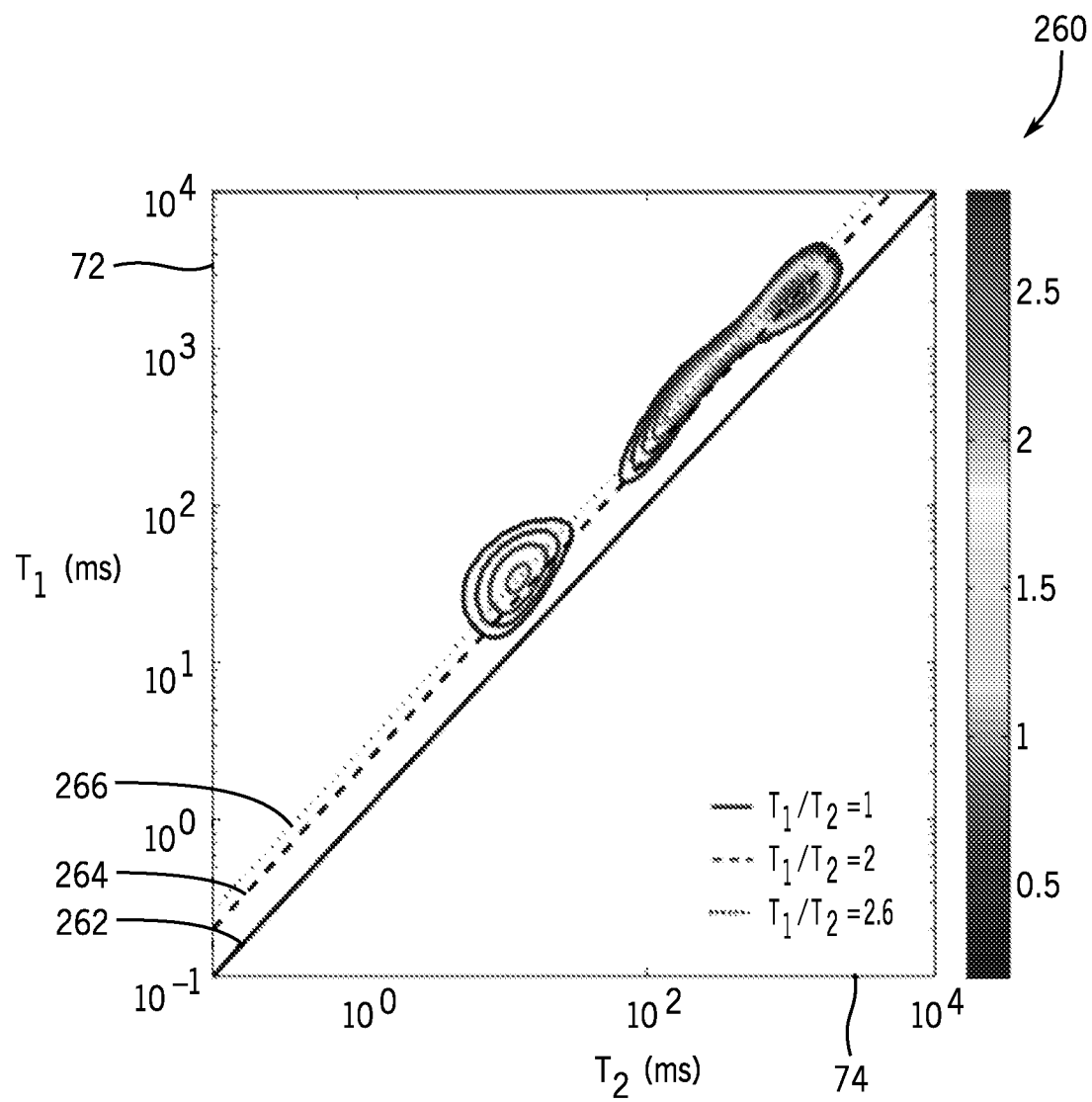
FIG. 4 is a T1-T2 map showing an example response for a first shale sample, in accordance with an embodiment.

A $T_1$-$T_2$ map 260 of a gas shale sample saturated with methane gas at 5000 psi is shown in FIG. 4. The T1-T2 map 260 illustrates NMR measurements of T1 relaxation time (ordinate 72) and T2 relaxation time (abscissa 74) each on a logarithmic scale. The T1-T2 map 260 includes lines that represent different T1/T2 ratios across the T1-T2 map 260. In particular, the T1-T2 map 260 shown in FIG. 4 includes a line 262 illustrating a T1/T2 ratio of 1, a line 264 illustrating a T1/T2 ratio of 2, and a line 266 illustrating a T1/T2 ratio of 2.6, the latter two passing through a local peak of the NMR measurements on the T1-T2 map 260. The $T_1$-$T_2$ ratio of the methane gas in the organic pores is around 2.6 and the $T_2$'s range from a few milliseconds to few tens of milliseconds, and therefore could overlap with the bound water signals. The gas in the annulus of the sample holder is shown to have a $T_2$ of more than 100 ms and $T_1/T_2$ ratio of 2 in FIG. 4. In other words, the methane gas in the organic porosity has a $T_2$ of 10 ms and a $T_1/T_2$ of 2.6 while the annulus gas (both around and above the cylindrical sample) have $T_2$ values greater than 100 ms with a $T_1/T_2$ ratio of 2.

Multi-Dimensional NMR in Tight/Shale Oil Formations

The light oil in the bulk state undergoes relaxation due to intermolecular and intramolecular dipolar relaxation which in general scales with their chain length. In the case of bitumen and other heavy oils the relaxation behavior is more complex due to the presence of asphaltene. The maltenes or the lighter fractions of the oils are relaxed by both the proton-proton intermolecular interactions modulated by the slow motions due to their interactions with the asphaltenes, and the proton-electron interactions with the paramagnetics and free radicals in the asphaltene. Additionally, the relaxation mechanisms of the oil in organic pores differ from those in the inorganic pores due to the wettability, and therefore NMR $T_1$-$T_2$ maps can be uniquely used as a probe for segregating the oil filled porosity into organic kerogen porosity versus inorganic mineral hosted porosity. The inorganic porosity in tight-oil shale is mixed wet, resulting in a reduction in the relaxation times of the oil and a $T_1$-$T_2$ ratio of about 1.2 to 1.5.

Figure 5:
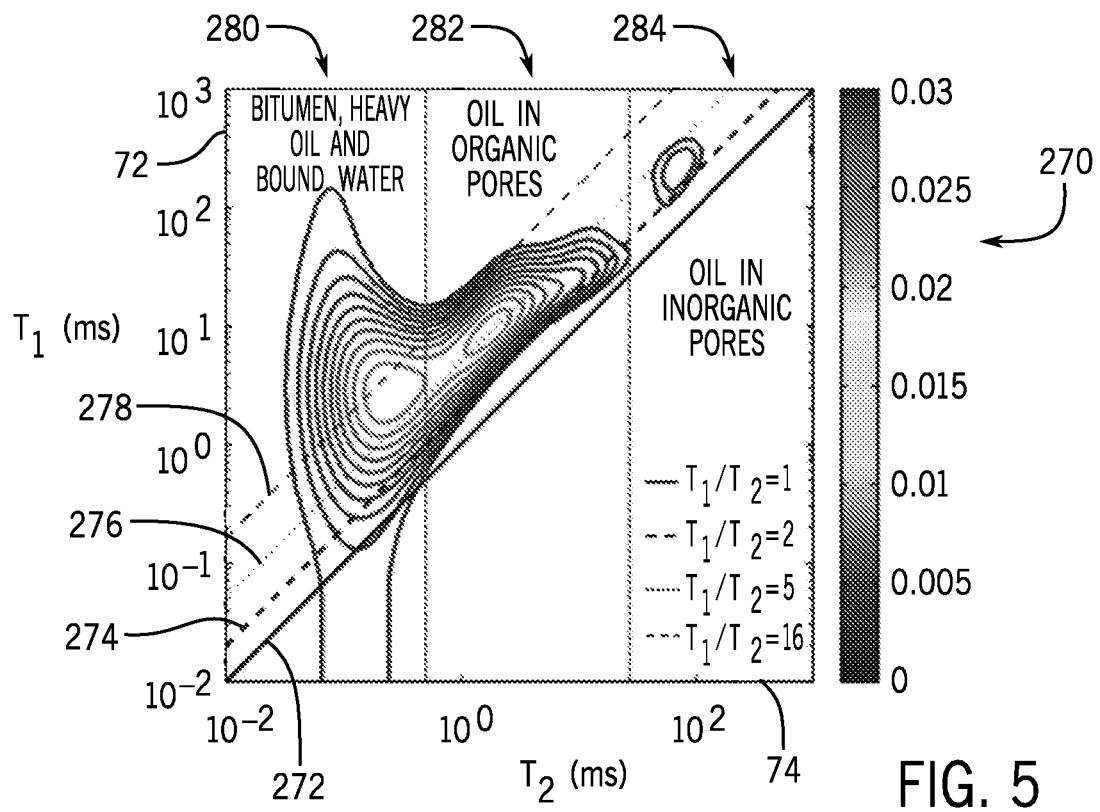
FIG. 5 is a T1-T2 map showing an example response for a second shale sample, in accordance with an embodiment.

An example of an NMR $T_1$-$T_2$ map 270 in tight oil shale is shown in FIG. 5. The T1-T2 map 270 illustrates NMR measurements of T1 relaxation time (ordinate 72) and T2 relaxation time (abscissa 74) each on a logarithmic scale. The T1-T2 map 270 includes lines that represent different T1/T2 ratios across the T1-T2 map 270. In particular, the T1-T2 map 270 shown in FIG. 5 includes a line 272 illustrating a T1/T2 ratio of 1, a line 274 illustrating a T1/T2 ratio of 2, a line 276 illustrating a T1/T2 ratio of 5, and a line 278 illustrating a T1/T2 ratio of 16, each of which passes through a local peak of the NMR measurements on the T1-T2 map 270. By comparing the location of the peaks of the measured T1 and T2 NMR measurements to the previously identified locations of various pore fluids (e.g., as illustrated in FIG. 3), the T1-T2 map 270 can be shown to have identified bitumen, heavy oil, and bound water in a region 280, oil in organic pores in a region 282, and oil in inorganic pores in a region 284.

Figure 6:
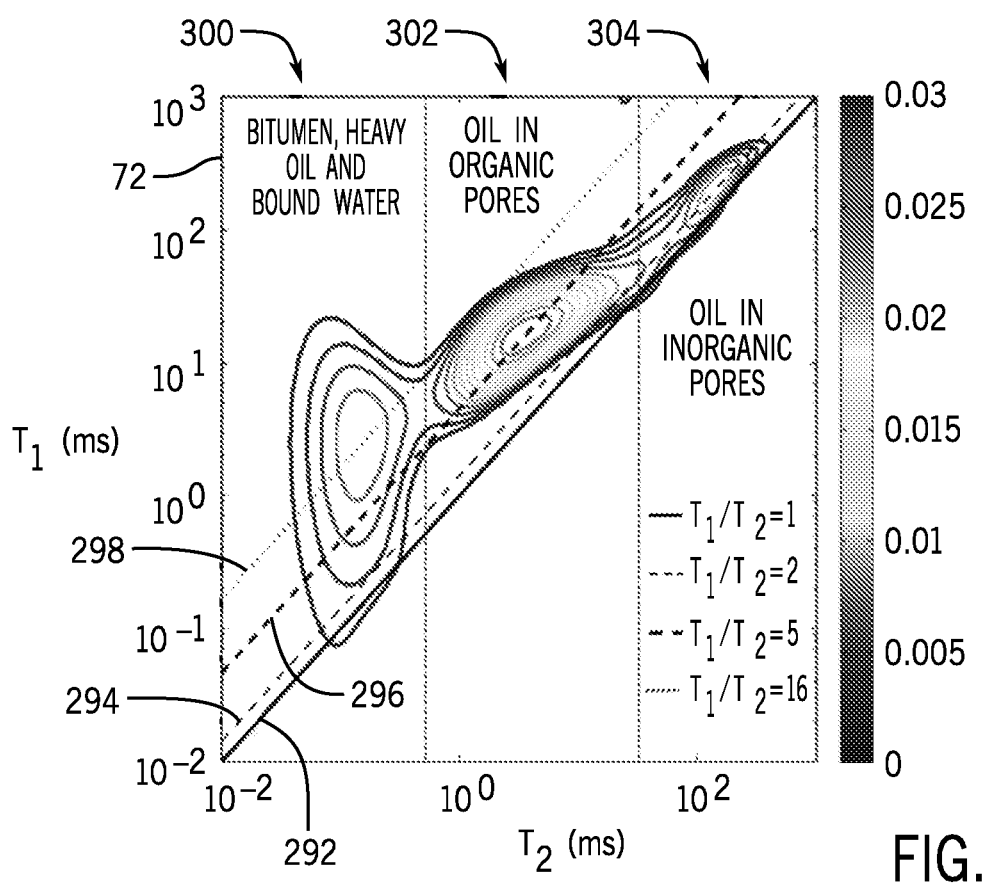
FIG. 6 is a T1-T2 map showing an example response for a third shale sample, in accordance with an embodiment.

An example of an NMR T1-T2 map 290 in tight oil shale is shown in FIG. 6. The T1-T2 map 290 illustrates NMR measurements of T1 relaxation time (ordinate 72) and T2 relaxation time (abscissa 74) each on a logarithmic scale.

The T1-T2 map 290 includes lines that represent different T1/T2 ratios across the T1-T2 map 290. In particular, the T1-T2 map 290 shown in FIG. 6 includes a line 292 illustrating a T1/T2 ratio of 1, a line 294 illustrating a T1/T2 ratio of 2, a line 296 illustrating a T1/T2 ratio of 5, and a line 298 illustrating a T1/T2 ratio of 16, each of which passes through a local peak of the NMR measurements on the T1-T2 map 290. By comparing the location of the peaks of the measured T1 and T2 NMR measurements to the previously identified locations of various pore fluids (e.g., as illustrated in FIG. 3), the T1-T2 map 290 can be shown to have identified bitumen, heavy oil, and bound water in a region 300, oil in organic pores in a region 302, and oil in inorganic pores in a region 304.

Indeed, FIG. 5 represents data from a native shale sample, where the $T_1/T_2$ ratios, together with the $T_2$, enable the separation of the bound water and bitumen signal from that of the oil in organic pores. is the native shale rock with the bitumen and bound water peaks at short T2 and the oil in the organic pores with T2 between 1 ms to 20 ms. There are no fluids in the inorganic pores or natural fractures in this case. This shows that the pressure drop during core retrieval can result in a large fraction of producible light oil and water can escape.

FIG. 6 represents data from a re-saturated shale sample, where a clear increase in the signal of the crude oil in the inorganic and organic porosities is found compared to the native samples. This demonstrates how the $T_1/T_2$ ratios enable separation of the different fluid components and environments. Indeed, in the case of the oil resaturated tight oil shale rock of FIG. 6, the increase in the oil in the organic (kerogen) pores can be clearly seen. Additionally, there is also a strong peak at longer T2 values (>50 ms), corresponding to the oil resaturating the in organic pores and natural fractures.

NMR T1-T2 Experimental Method

As noted above with reference to FIG. 2, this disclosure describes a methodology for estimation of properties of subsurface earth from NMR T1-T2 logging measurements. The methodology includes:

(1) Acquisition of logging data which are sensitive to T1 and T2 relaxation time distributions of formation fluids using downhole NMR logging tools;

(2) Estimation of T1-T2 maps from logging data using inversion methods which take into account the effect of motion of the logging tool; and (3) Estimation of sub-surface properties from T1-T2 maps.

T1 and T2 data contain information about the motion of fluid molecules. The T2 relaxation time is dominated by low frequency molecular motions, while T1 is governed by fast molecular motions driven by fluctuations at the Larmor frequency. Simultaneous measurement of T1 and T2 relaxation time distributions can therefore provide information about the types of formation fluids and their volumes. Additionally, formation properties such as porosity, permeability can also be estimated.

Figure 7:
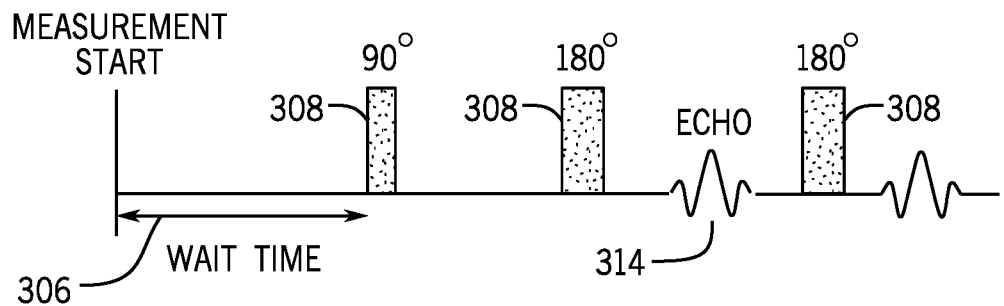
FIG. 7 is a timing diagram showing a Carr-Purcell-Meiboom-Gill (CPMG) sequence for an NMR measurement, in accordance with an embodiment.

NMR logging measurements are acquired using specially designed data acquisition schemes (called pulse sequences) which describe the timings of transmission and reception of electromagnetic signals. The pulse sequence for the measurement of T2 relaxation time distribution is called the CPMG echo train, and is shown in FIG. 7. The CPMG echo train includes an initial idle time or wait time 306, which may be suitable for nuclei in formation fluids to come to equilibrium with a magnetic field induced by the permanent magnet of the tool. Thereafter, a series of radio-frequency pulses are applied using an antenna (e.g., a first pulse 308 $B_0$ and followed by two pulses 310 and 312). Midway between two RF pulses, NMR signals called echoes 314 may be formed, which may be measured using suitable devices (e.g., via the antenna). The amplitude of the echoes 314 decay or attenuate with time. By fitting the echo amplitudes to a multi-exponential model, the T2 distribution is obtained. The time between adjacent 180-degree pulse is the echo spacing (TE). The initial wait time (WT) is often long enough to fully polarize the system.

In such an embodiment such as described above, a train of echo signal is acquired.

The signal amplitude, S, is measured as a function of the echo time, $t_{echo}$ (the time of the echo from the beginning of the first 90-degree pulse), $$t_{echo} = n*TE \quad (5)$$

where n is the number of echo and TE is the echo spacing (time between two adjacent 180-degree pulse, such as 310 and 312). The signal amplitude then follows an exponential decay form, which may be represented as:

$$S(t_{echo}) = S(0)\exp\left(-n*\frac{TE}{T_2}\right), \quad (6)$$

for a sample with a single T2. For many samples where a range of T2 is present, the total signal is a sum of all T2 components, $$S(t_{echo}) = \int dT_2 f(T_2)\exp\left(-n*\frac{TE}{T_2}\right), \quad (7)$$

where f(T2) is the T2 distribution function.

Figure 8:
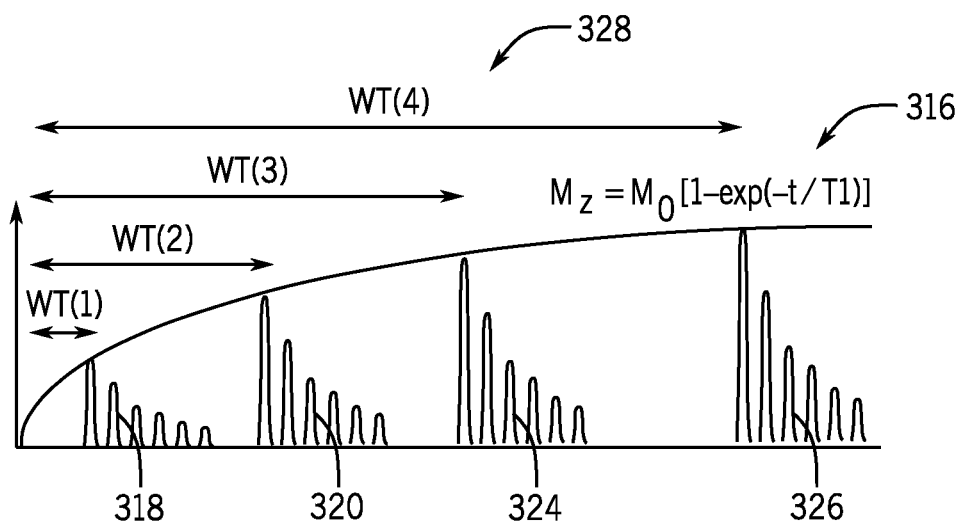
FIG. 8 is a timing diagram showing a composite result of multiple CPMG pulse sequences for a simultaneous T1-T2 two-dimensional (2D) NMR measurement, in accordance with an embodiment.

Measurement of T1-T2 relaxation time distribution is enabled by acquiring a suite (e.g., a set of, multiple, etc.) of CPMG echo trains with varying wait times as shown in FIG. 8. FIG. 8 shows a schematic 316 (e.g., timing diagram) of pulse sequences 318, 320, 324, and 326 for simultaneous T1-T2 measurement. In the equation, the symbol t is the wait time, WT. As the wait time WT increases, the amplitude of echoes increases according to the T1 relaxation time of the fluids.

In such an embodiment as illustrated in FIG. 8, the signal growth (e.g., alone line 328) may be represented via the following equation, that is a function of the wait time, WT:

$$1 - \exp\left(-\frac{WT}{T_1}\right), \quad (8)$$

assuming the initial signal is zero at zero WT. The relevant relaxation involved in this part is T1, the spin-lattice relaxation time. As a result, the signal dependence of both WT and echo time $t_{echo}$ is:

$$S(WT, t_{echo}) = \int dT_1 dT_2 f(T_1, T_2)\left[1 - \exp\left(-\frac{WT}{T_1}\right)\right]\exp\left(-n*\frac{TE}{T_2}\right), \quad (9)$$

By fitting the data to a two-dimensional exponential model, the simultaneous T1-T2 distribution, f(T1,T2), is obtained. The inversion can be done as described in Song, Y.-Q. (2013), Magnetic Resonance of Porous Media (MRPM): A perspective. *Journal of Magnetic Resonance*, 229, 12-24.

As it would be appreciated by one of ordinary skill in the art, one important parameter in the design of NMR pulse sequences is the logging speed, which refers to the speed at which the logging tool traverses the borehole. Higher logging speed provide significant cost savings of rig-time and allow to reduce the risk of the logging tool getting stuck in the borehole or slipping. Measurement quality (resolution) increases with the number of echo trains in the suite, and the total time needed for acquiring the suite of CPMG echo trains for T1-T2 measurement per depth dictates the logging speed. The shorter the acquisition time is, the higher is logging speed can be achieved to acquire data of the same vertical resolution. Therefore, the design of pulse sequence may involve a trade-off between resolution and logging speeds. To increase data quality without sacrificing logging speeds, the methodology disclosed here involves acquisition of several echo trains with short wait times (e.g., less than 100 ms). This data acquisition scheme provides several advantages. For example, short wait times reduce the total data acquisition time, thereby resulting in higher logging speed. Additionally, the echo trains with short wait times can be repeated in quick succession to increase the signal to noise ratio (SNR) of the measurements. High SNR increases the resolution of features obtained from the data. Further, by acquiring several echo trains with short wait times, the resolution of short T1 and T2 relaxation times is greatly enhanced. The enhanced resolution of short T1 and T2 relaxation times is valuable for characterizing fluids in shale formations which contain pores of very small sizes. In one embodiment, the pulse sequence for simultaneous measurement of T1-T2 relaxation time involves a suite of 6 CPMG echo trains. The wait times for the first 5 echo trains are logarithmically spaced between 1 and 100 ms. The wait time for the 6$^{th}$ echo train is chosen to be long enough to ensure almost complete polarization of nuclei with magnetic field thereby providing accurate porosity measurement. An example of the pulse sequence parameters is shown in Table 1.

TABLE 1

An example of the sequence parameters for T1-T2 measurement

| Wait Time (ms) | 10, 20, 50, 80, 200, 400, 1000, 3000, 9000 |
|---|---|
| Echo Spacing (ms) | 0.5 |
| Number of Repeats | 16, 8, 4, 4, 2, 2, 1, 1, 1 |

Figure 9:
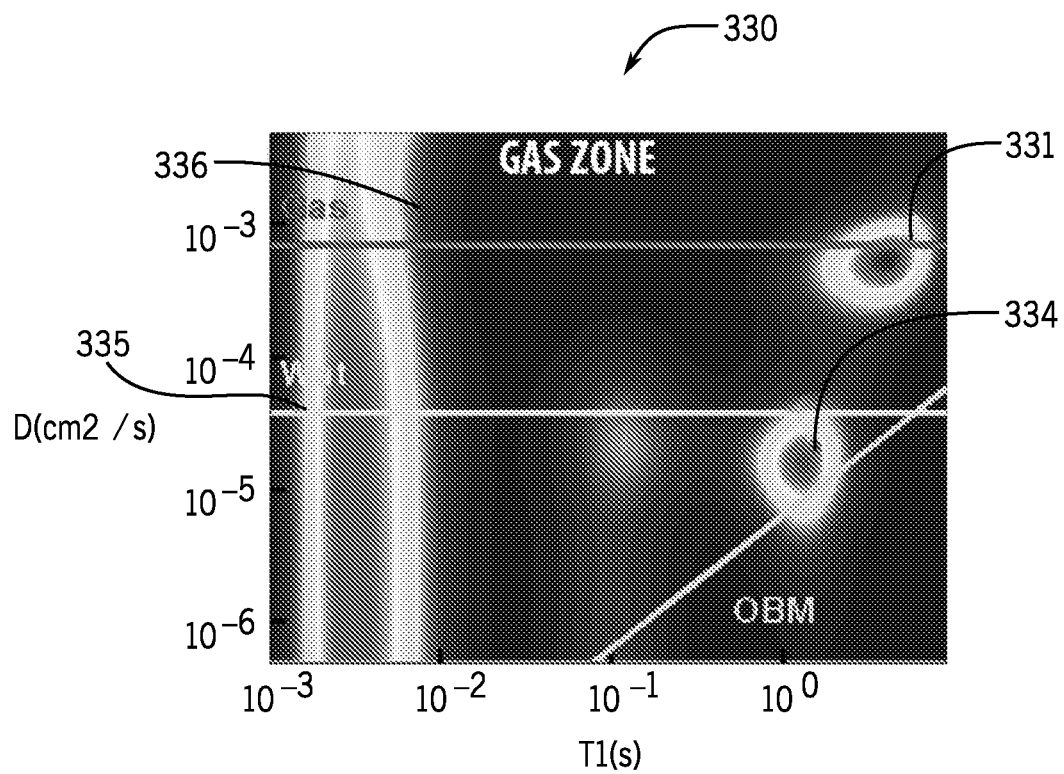
FIG. 9 is a diffusion-T2 map showing an example response in a gas zone, in accordance with an embodiment.
Figure 10:
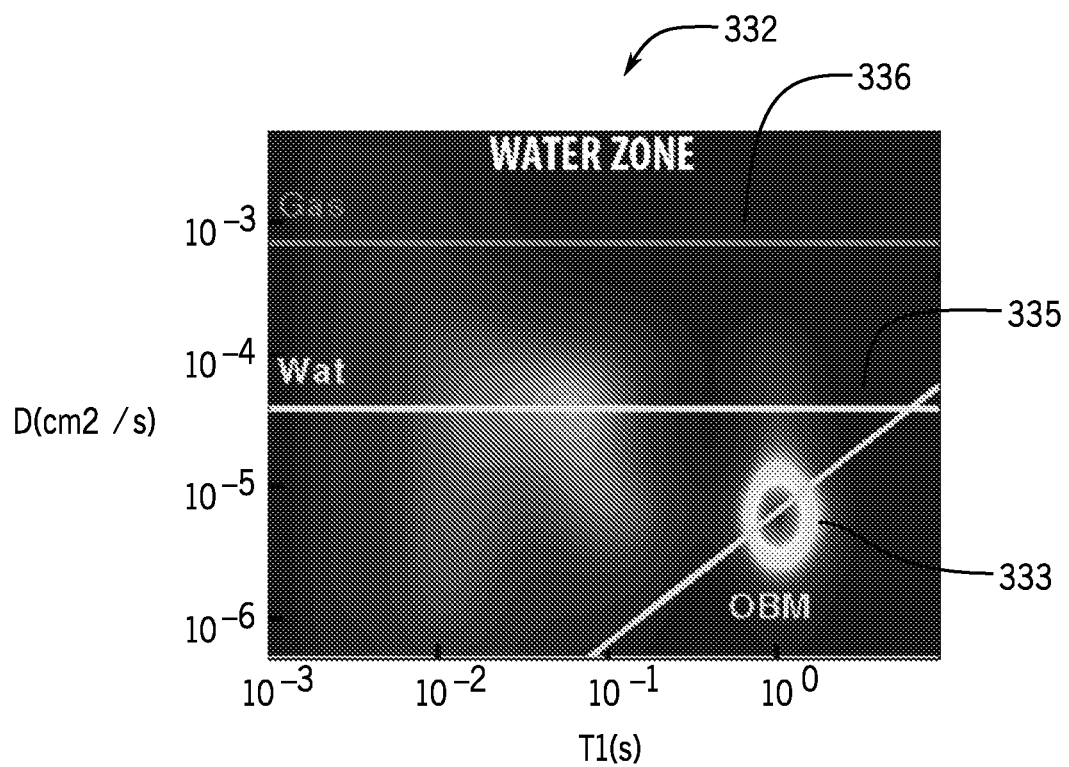
FIG. 10 is a diffusion-T2 map showing an example response in a water zone, in accordance with an embodiment.

As it should be appreciated by one of ordinary skill in the art, two-dimensional (2D) or multi-dimensional (MD) maps are not limited to T1-T2, but may include diffusion-T2, T1-T2-D, diffusion-diffusion correlation. For example, FIG. 9 is a diffusion-T2 map 330 showing an example response in a gas zone, in accordance. FIG. 10 is a diffusion-T2 map 332 showing an example response in a water zone. In particular, the diffusion-T2 map 330 shows a gas signature 331 and a water signature 334. While the diffusion-T2 map 332 does not show a gas signature, it does show a water signature 333. Additionally, the diffusion-T2 maps 330 and 332 include lines 335 and 336 that represent the approximate regions of water and gas, respectively.

One embodiment of the present disclosure is direct to obtaining 2D or multi-dimensional (MD) measurements more efficiently. In certain 2D or MD experiments, more scans than are needed may be performed to obtain a data set. As a result of the number of scans, the downhole NMR tool 12 may remain at approximately the same position in the formation 14, which reduces the logging speed. Additionally, movement of the downhole NMR tool 12 before and during data acquisition may affect the response, and as a result, the acquired data. This disclosure provides systems and methods that may reduce the number of scans to improve the logging speed for MD experiments.

In certain MD experiments, the movement of the tool before and during the data acquisition affects the response and therefore the acquired data. Such movement may change the signal equation to deviate from Equation 9. To address this, the motion effect may be analyzed to identify a corrected kernel function.

In uniform field and at zero logging speed, the amplitude of the signal can be easily obtained. Assuming that the sample has reached the thermal equilibrium magnetization $M_o$, the application of the CPMG sequence creates the transverse magnetization signal given by:

$$A(t_{echo}, WT) = \iint dT_1 dT_2 f(T_1, T_2) k_{T_1 T_2}(t_{echo}, WT) \quad (10)$$

Here $k_{T_1T_2}(t_{echo}, WT)$ is the kernel that described the known sensitivity of the measurement to the relaxation times $T_1$ and $T_2$, and $f(T_1, T_2)$ is the two-dimensional distribution function of interest. As mentioned, a standard implementation of $T_1$-$T_2$ NMR measurements consists of a series of CPMG sequences, separated by wait time WT. For static samples in homogeneous fields, the kernel is then given by:

$$k_{T_1T_2}(t_{echo}, WT) = (1-\exp\{-WT/T_1\})\exp\{-t_{echo}/T_2\}$$

To determine the distribution function $f(T_1, T_2)$, a set of measurements is acquired for different parameters $t_{echo}$ and WT. Based on Eq. 10, this data is then inverted to extract $f(T_1, T_2)$. For the kernel given in Eq. 11, the inversion algorithm is then essentially an inverse Laplace transformation. Note that the kernel has a simple, separable form: the first term depends on WT and $T_1$, while the second term depends on $t_{echo}$ and $T_2$. Details of the inversion are discussed in more detail below.

When these measurements are performed with a moving logging tool, two effects modify the standard kernel given in Eq. 11: (i) the inhomogeneity of the magnetic field applied to the sample, and (ii) the relative motion between the logging tool and the sample. At a given time, a small part of the sample is on resonance and experiences perfect pulses. As a consequence, off-resonance effects and the time dependence are important factors and influence the spin dynamics. The modified kernel may be more complicated than Eq. 11 as it may depend on the logging speed and on the characteristics of the logging tool; in particular, on the field profiles of the static magnetic field along the tool and on the RF magnetic field in the sensitive zone. In general, the kernel also does not have the simple separable form of Eq. 11 anymore. To determine the kernel for the most general case, numerical simulations may be used to determine kernel accurately for a logging tool. After integrating the Bloch Equations for relevant relaxation times, wait times, echo times, and logging speeds, the results can be parameterized by a number of dimensionless parameters to obtain a useful version of the modified kernel. Some dimensionless parameters include the quantities $WT/T_1$, $vT_1/L_{det}$, and $L_{prepol}/L_{det}$. Here $L_{det}$ is the length of the sensitive zone of the NMR detector and $L_{prepol}$ is the length of the magnet section ahead of the sensitive zone that is used to polarize the sample.

Figure 11:
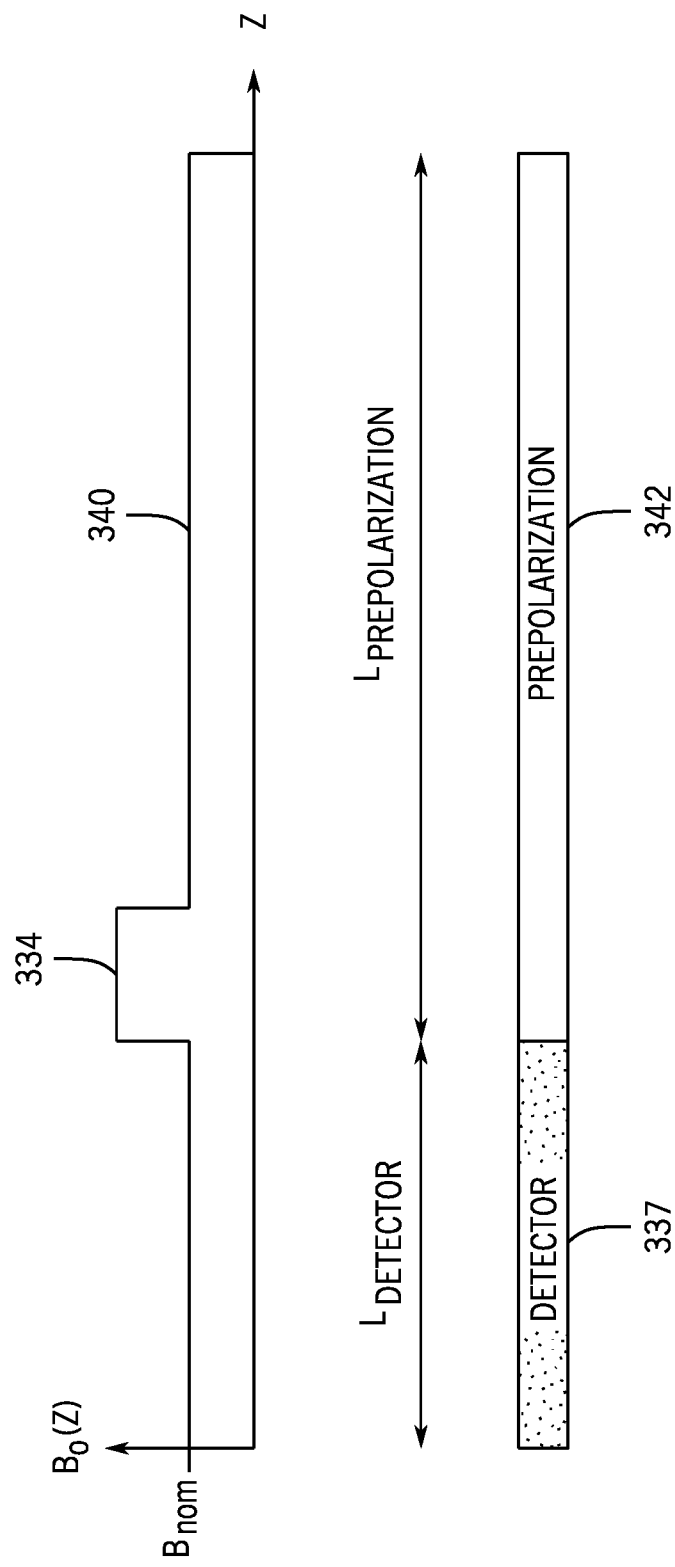
FIG. 11 is a schematic diagram of a moving NMR logging tool, in accordance with an embodiment.

The kernel may be identified considering a simple field profile such as shown in FIG. 11. The impact of the inhomogeneity of the magnetic fields in the direction perpendicular to the tool motion on the T1-T2 kernel may be mitigated by using appropriate crusher pulses that are applied at the end of the CPMG sequence. Also, the RF field may be confined to the detector region 337 with a uniform amplitude along its length, as shown in the simplified logging tool schematic of FIG. 11, and the magnetic field (e.g., indicated by the line 340) is generally uniform along axis 338 in the detector region 337. As shown, the magnetic field 340 may be non-uniform in the pre-polarization region 342, the non-uniform region is indicated by the bump 344. The following discussion may proceed with the understanding that such crusher pulses have been appended to the CPMG sequences.

For this case, the modified kernel for a moving tool has the structure:

$$k_{T_1T_2}(t_{echo}, WT, v) = k_1(WT, v; T_1) k_2(WT, t_{echo}, v; T_1) k_3(t_{echo}; T_2) \quad (12)$$

The terms $k_1(WT, v; T_1)$ and $k_2(WT, t_{echo}, v; T_1)$ are related to the profile of the longitudinal magnetization in the detector section at the start of the CPMG sequence, $M_z(z; v, WT, T_1)$:

$$k_1(WT, v; T_1) = \frac{1}{M_o} \int_{det} dz M_z(z; WT, v; T_1) \quad (13)$$

$$k_2(WT, t_{echo}, v; T_1) = \begin{cases} 1 - \dfrac{\int_0^{vt_{echo}} dz M_z(z; v, WT, T_1)}{\int_0^{L_{det}} dz M_z(z; v, WT, T_1)} & \text{if } vt_{echo} \leq L_{det} \\ 0 & \text{if } vt_{echo} > L_{det} \end{cases} \quad (14)$$

Here, z is the coordinate of the formation along the tool axis and the motion direction. The last term $k_3(t_{echo}, T_2) = \exp\{-t_{echo}/T_2\}$ is identical to the last term in the standard kernel, Eq. 11.

In this model, the longitudinal magnetization in the detector section at the start of the CPMG sequence is given by:

$$M_z(z; WT, v; T_1) = \quad (15)$$

$$\begin{cases} \dfrac{M_0}{vT_1 B_{0,nom}} \int_0^{\infty} du B_0(z+u) \exp\{-u/vT_1\} & \text{if } z \geq vWT \\ M_0(1 - \exp\{-WT/T_1\}) & \text{if } z < vWT \end{cases}$$

Figure 12:
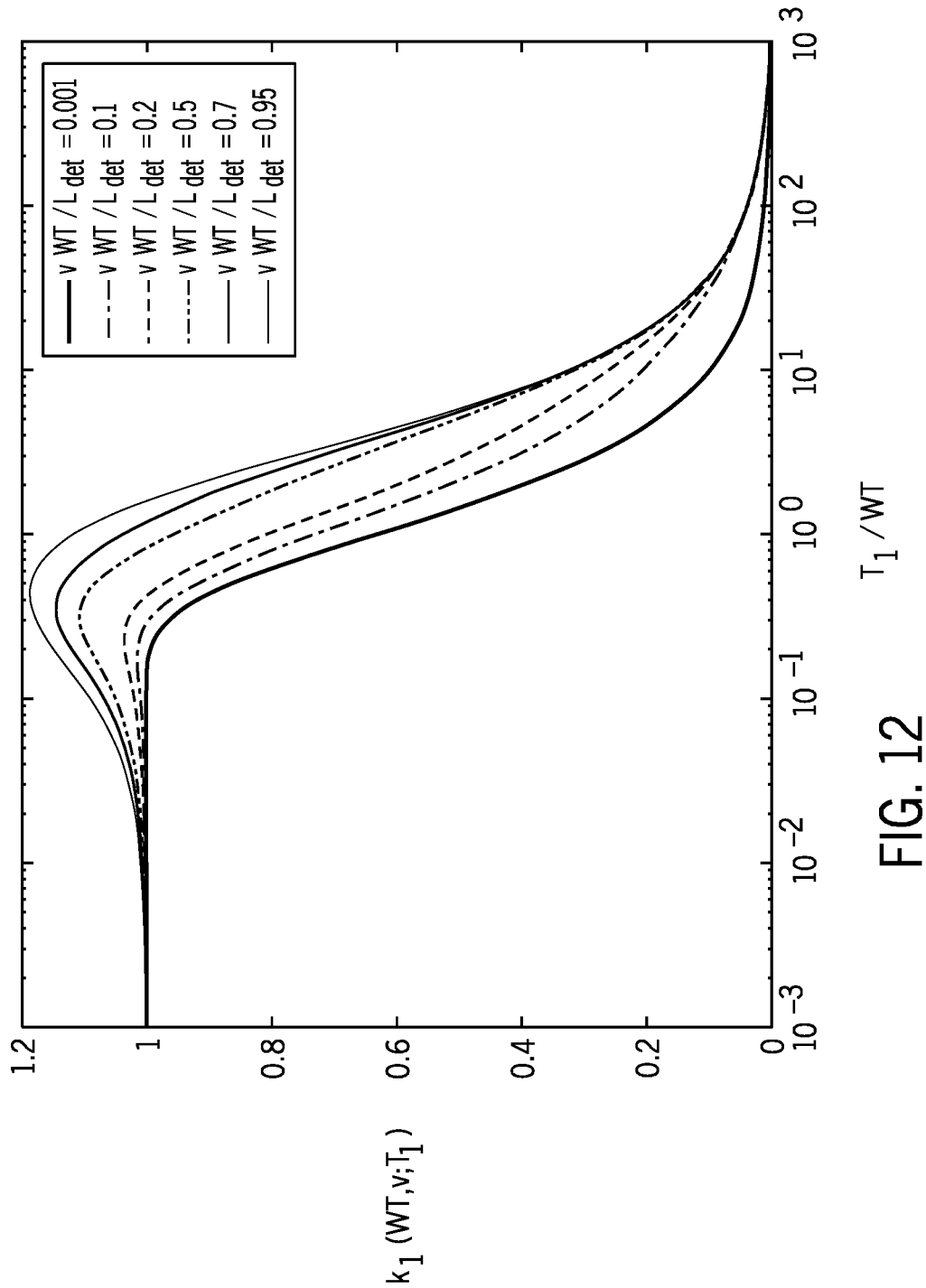
FIG. 12 is an example plot of a kernel for the moving NMR logging tool of FIG. 11, in accordance with an embodiment.

For the simple field profile shown in FIG. 11, the modified kernel can be obtained analytically. The first part of the kernel determines the initial amplitude of the CPMG signal and it depends on the wait time, the logging speed and longitudinal relaxation through the dimensionless ratios $T_1/WT$ and $(v\,WT/L_{det})$. The results for $k_1(WT, v; T_1)$ are shown in FIG. 12.

Figure 13:
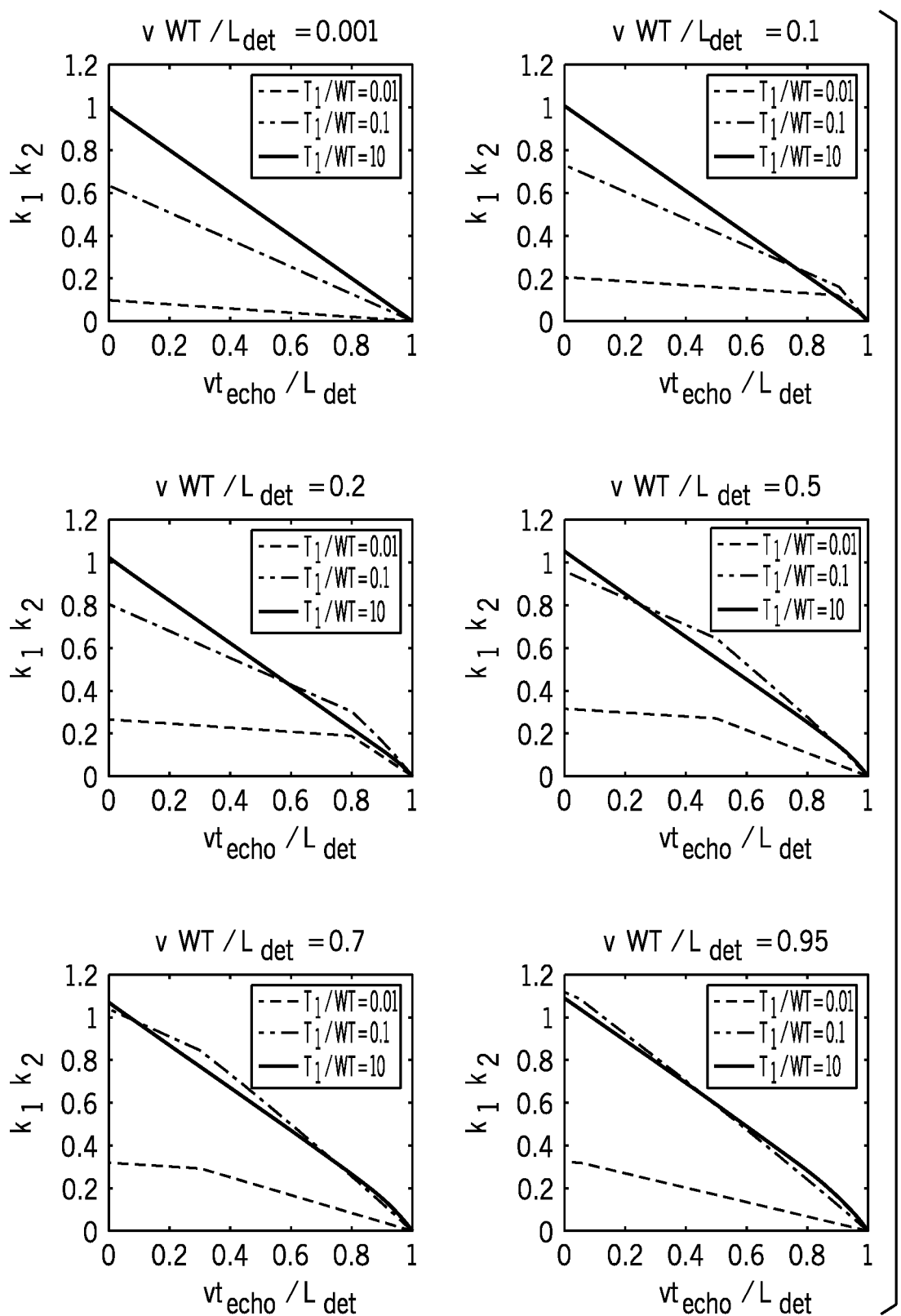
FIG. 13 are plots showing examples of partial kernels for the moving NMR logging tool of FIG. 11, in accordance with an embodiment.

The second part of the kernel, $k_2$, describes the enhanced signal decay during the CPMG train due to motion. FIG. 13 displays the results of the product of $k_1$ and $k_2$ for the model in FIG. 11. It shows that the enhanced signal decay depends not just on the logging speed and echo time, but also on $T_1$ and the wait time WT. For a robust extraction of $T_1$-$T_2$ distributions from logging data, the term $(1-\exp\{-TW/T_1\})$ in Eq. 9 for the inversion may be replaced by the more complex functions shown in FIG. 13. The results of FIGS. 12 and 13 are illustrative examples. The exact kernels for an actual logging tool may be qualitatively similar to these results, but for quantitative results, it may involve determining the kernel specifically for a given downhole NMR tool 12 (e.g., logging tool). This can be done either by numerical calculations based on the known field profiles, or by extensive calibration measurements with a moving downhole NMR tool 12. In general, the determination of the accurate $T_1$-$T_2$ kernel may be useful for calibrating the downhole NMR tool 12.

Inversion Based on Regularization

There are numerous methods to perform data inversion to obtain the 2D and MD maps (or distributions). Some of them are reviewed in Song, Y.-Q. (2013). Magnetic Resonance of Porous Media (MRPM): A perspective. *Journal of Magnetic Resonance*, 229, 12-24, which is incorporated by reference herein in its entirety. As an example, this disclosure will discuss the regularization method based on Song, Y.-Q., Venkataramanan, L., Hürlimann, M. D., Flaum, M., Frulla, P., & Straley, C. (2002). T(1)—T(2) correlation spectra obtained using a fast two-dimensional Laplace inversion. *Journal of Magnetic Resonance*, 154(2), 261-268 (hereinafter, Song 2002) which is incorporated by reference herein in its entirety.

The general inversion can be described by the following. Given a dataset M, measured at a series of parameters (e.g. tau), the goal is to determine distribution function F, so that M=KF, within the statistics of the data noise. For an example of a $T_2$ measurement, multiple data points are obtained at different echo time, $t_{echo}$ (or tau2). The distribution function is expressed as a function of $T_2$, the spin-spin relaxation time. $T_1$ may be discretized in an array, e.g. from 0.001 sec to 10 s. This equation can be approximated by a discretized matrix form:

$$M = KF, \quad (16)$$

where M is the data vector, K is called kernel matrix, and F the distribution vector, respectively. Only M and K are known. The true solution F should satisfy the above equation by $\|M-KF\| \leq sigma$, where $\|M-KF\|$ is the vector norm and sigma is the noise variance. Given a finite SNR, many solutions satisfy this criterion, and this is the source of the ill-conditioned nature of the Laplace inversion.

Generally, the regularization method obtains a fit to the data through minimization of the following expression:

$$\|M-KF\|^2 + alpha\|F\|^2, \quad (17)$$

The first term measures the difference between the data and the fit, KF. The second term is a Tikhonov regularization term and its amplitude is controlled by the parameter alpha. The effect of this regularization term is to select out a solution with a small 2-norm $\|F\|^2$ and as a result a solution that is smooth and with fewer sharp spikes. However, it may cause a bias to the result. When alpha is chosen such that the two terms are comparable, the bias is considered minimized and the result is stable in the presence of noise.

The regularization method as discussed above also applies to 2D inversion. The key difference is that the distribution function, F is now a function of two variables, for example, the variables can be $T_1$ and $T_2$, or $T_2$ and D. Of course, this can be extended to 3D or higher dimensions.

Figure 14:
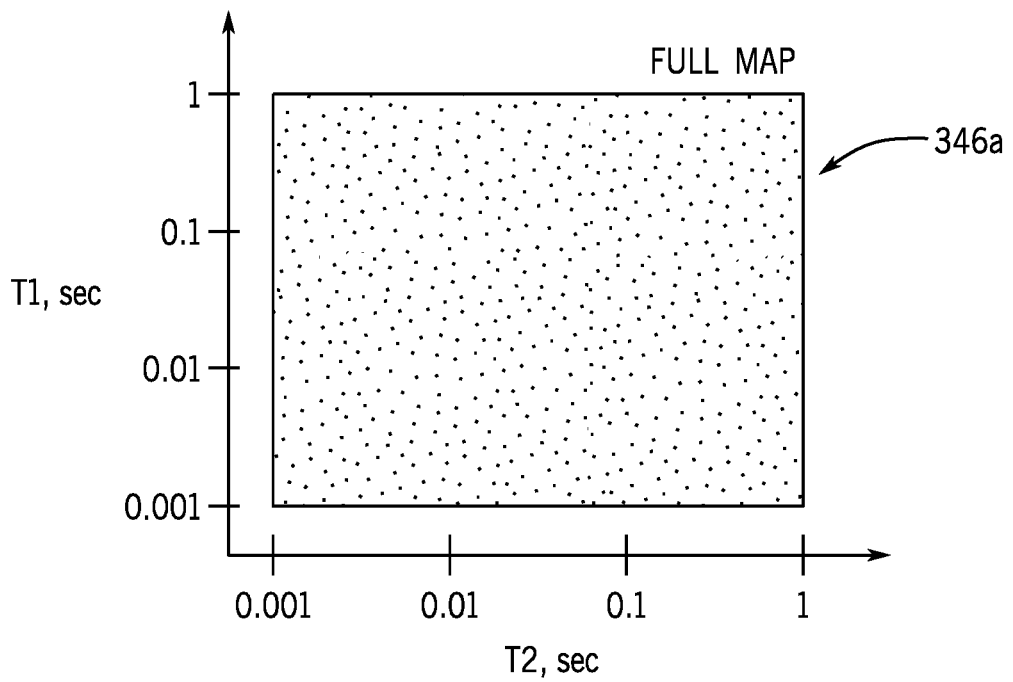
FIG. 14 is an example of a full mask for a T1-T2 distribution, in accordance with an embodiment.

Thus, in case of T1-T2 experiments, the resulting distribution is a 2D map, in the sense that the distribution function is defined on a two-dimensional grid of T1 and T2. Each variable (T1 or T2) can take on any value from a range. For example, in certain T1-T2 experiments, the range of T1 and T2 is from 0.001 to 10 s. As discussed herein, a mask 346 may be applied to a map to reduce computation time. FIG. 14 shows a mask 346a that fills a rectangular area in the T1-T2 space. In some embodiments, a portion of T1-T2 map is suitable for determining properties of the formation. In such embodiments, the rectangular mask 346a may be suitable. However, in other embodiments, a more complex mask 346, or multiple masks may be employed. In some embodiments, the mask may be defined either by previous measurements or by an operator during the measurement based on the one or more NMR measurements.

As discussed earlier, many solutions satisfy this criterion (Eq. 16), and this is the source of the ill-conditioned nature of the Laplace inversion. One of the sources of the ill-conditioned nature of the inversion is that the distribution F (whether one-dimensional (1D) or 2D) has many elements. For example, for a T1-T2 map of 100 points along each dimension, there are 10,000 independent elements of F. One approach to improve the inversion is to reduce the total number of F elements in the inversion. In particular, when prior knowledge of the samples under investigation dictates a smaller range of parameters, it is then better to formulate the size of the map to match the smaller range of the T1, T2 values, by reducing the maximum T1 or T2. However, this method of reducing the map is limiting and may not be able to take advantage of the knowledge of the sample accurately.

Equation (16) can be used for 2D inversion by the following method. A 2D distribution function, F(T1,T2) can be shown in a matrix form: different columns (second index) are for different T2 values, and different rows (first index) are for T1, as shown below for a 3 by 3 example:

$$F = \begin{bmatrix} F_{1,1} & F_{1,2} & F_{1,3} \\ F_{2,1} & F_{2,2} & F_{2,3} \\ F_{3,1} & F_{3,2} & F_{3,3} \end{bmatrix}, \quad (18)$$

This matrix can be rewritten as a column vector ($\bar{F}$) by re-arranging the elements:

$$\bar{F} = \begin{pmatrix} F_{1,1} \\ F_{2,1} \\ F_{3,1} \\ F_{1,2} \\ F_{2,2} \\ F_{3,2} \\ F_{1,3} \\ F_{2,3} \\ F_{3,3} \end{pmatrix}, \quad (19)$$

Correspondingly, the data in a 2D experiment can be measured as a function of more than one variable, such as shown in FIG. 5, the data can be written in a 2D matrix, or in a column vector. Thus, every element of the data vector M corresponds to a pair of experimental parameters, e.g. WT and $t_{echo}$ (or tau2).

Once the data and the distribution are expressed in vector form, the kernel matrix can be formulated:

$$K_{p,q} = K(WT_p, \text{tau2}_p, T1_q, T2_q), \quad (20)$$

where p and q are the index to the kernel matrix, and $WT_p$ and $\text{tau2}_p$ are the WT and tau2 values for the p-th data point in M, and $T1_q$, $T2_q$ are the values of the q-th element in $\bar{F}$. Thus, the 2D problem can be converted to a 1D problem and directly use a 1D algorithm for inversion. Here kernel (Eq. 20) is an example. More complex kernels such as including speed effect (Eq. 12-14) can be used. The above example for T1-T2 measurements is meant to describe one of many parametrizations that may be used to perform inversion. Other parametrizations can also be used. For example, T2 and ratio of T1 and T2 can be used as two independent variables.

Full Map vs. Partial Map

Figure 15:
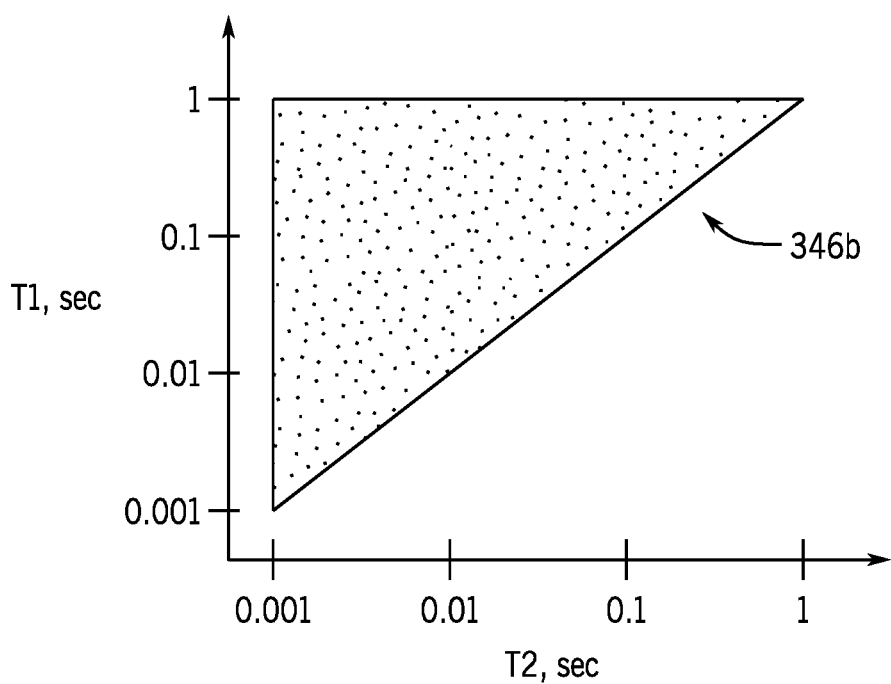
FIG. 15 is an example of a partial mask for a T1-T2 distribution that does not interpret values lower than T1/T2=1, in accordance with an embodiment.

As discussed earlier, a map that can take any values of the variables may be considered a full map (e.g., as shown in FIG. 14). The mask can be represented in a rectangular (or square) matrix and the inversion often invert for this full map. Putting this matrix into its 1D format has the advantage of the ability to select a subset of the matrix element for inversion. One example of a mask 346b can be shown in FIG. 15 where the matrix element below T1=T2 line is excluded from inversion and the elements with T1 larger or equal T2 are used for inversion.

Figure 16:
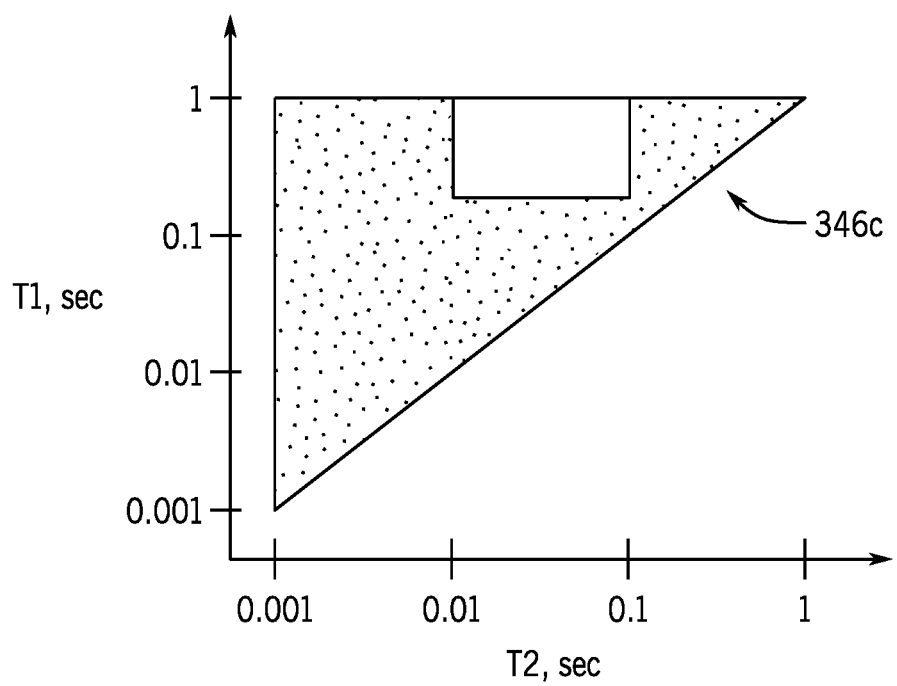
FIG. 16 is an example of a partial mask for a T1-T2 distribution that does not interpret values lower than T1/T2=1 or an area that rarely describe fluids of interest, in accordance with an embodiment.

Another exemplary mask 346c is shown in FIG. 16. In some embodiments, if there is prior knowledge (e.g., through other measurements) that a particular sample does not have any signal within an area of T1=0.1 to 1 sec, and T2=0.01 to 0.1 s (marked by the white rectangle), one can then exclude those elements of F and thus reduce the total number of elements in the inversion.

Figure 17:
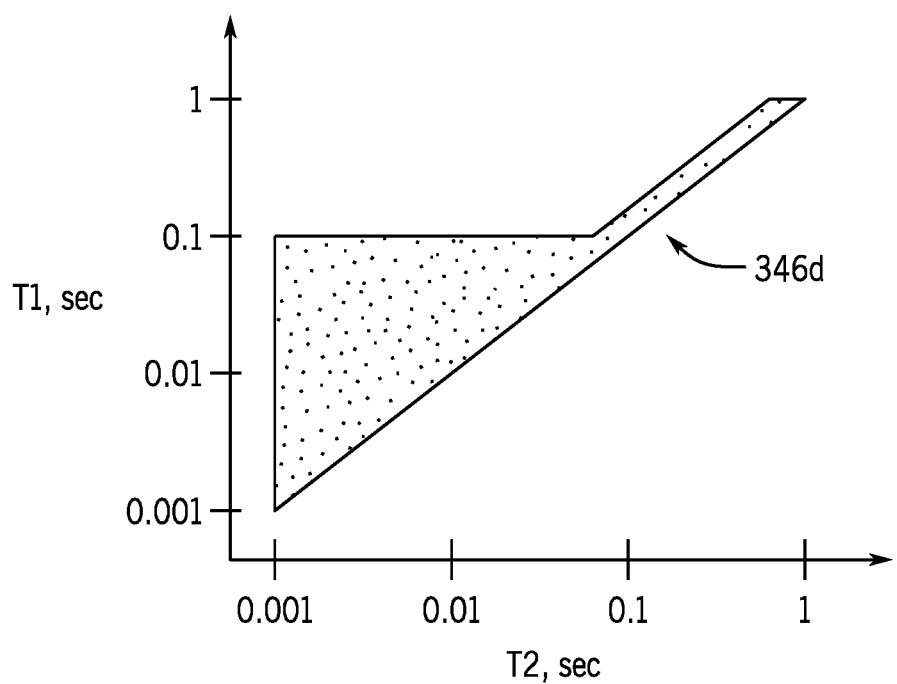
FIG. 17 is an example of a partial mask for a T1-T2 distribution that does not interpret values lower than T1/T2=1 or a larger area that is less likely to describe fluids of interest, in accordance with an embodiment.

Another example of a mask 346d is shown in FIG. 17. In this example, the solid area is the allowed area (e.g., does not set the other values in the plot to zero or substantially zero). The vector elements of F-bar in the blue area are used for inversion. For shale and tight oil formations, different fluids appear in different areas of the T1-T2 map. For example, light oil and water in large pores will exhibit relatively longer T1 and T2 (larger than 0.01 s) and T1/T2 ratio is close to 1. On the other hand, bitumen and kerogen signals appears below T1 and T2 of 0.01 s and can show a very large T1/T2 ratio, up to several hundred at low magnetic field and even higher in high magnetic fields. As a result, the total elements for inversion can be greatly reduced.

Figure 18:
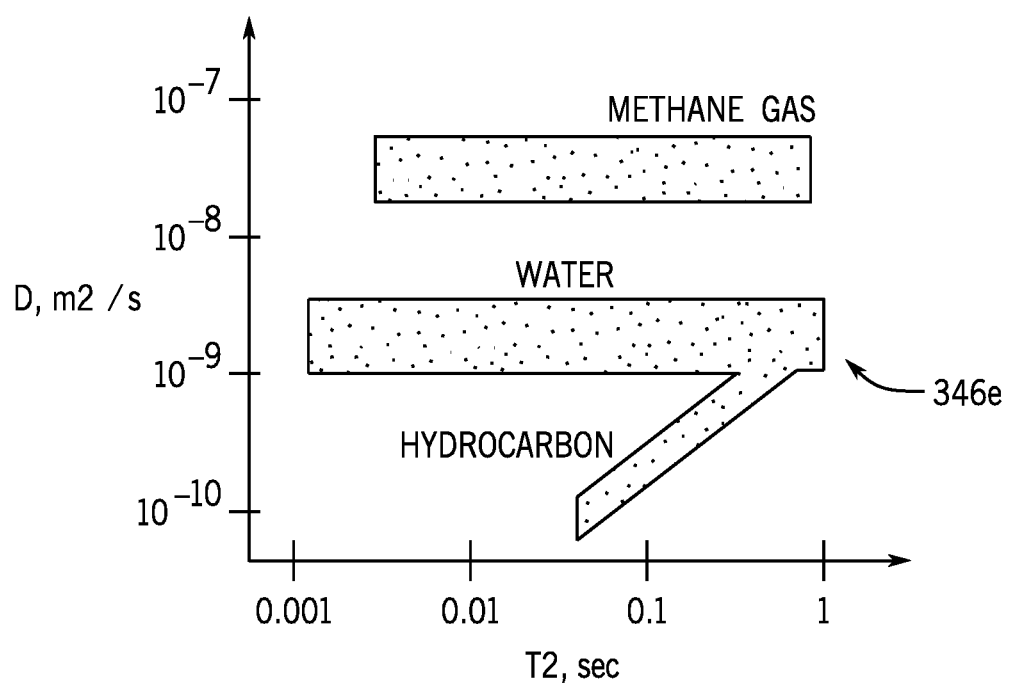
FIG. 18 is an example of a partial mask for a diffusion-T2 distribution that does not interpret certain values that are not likely to contain fluids of interest, in accordance with an embodiment.

In other examples, such as D-T2, it is also useful to define partial map mask based on the properties of the sample of investigation. Put differently, rather than a mask defining a particular area, a mask 346 may define multiple portions within a map. For example, the mask 346e for D-T2 map shown in FIG. 18 covers several distinct portions of the D-T2. The excluded portions may be selected based on portions of the map that generally would not have signals of interest. For example, prior knowledge of a formation may indicate that the formation contains an amount of methane gas, oil, and water that would provide a suitable amount of signal to be detected. Each of these components (e.g., the methane gas, oil, and water) exhibit unique behavior in the D-T2 map. For example, the diffusion constant of water is in the range of (1-5) $10^{-9}$ m$^2$/s dependent on the formation temperature, and the NMR signal for oil may exhibits a strong correlation of D and T2. As such, the mask 346 may selectively include signals from oil, water, and gas, or any combination thereof, while excluding other portions based on such information.

Such patterns can be obtained either from modeling of the fluid behavior (including surface relaxation, restricted diffusion, scaling behavior for hydrocarbon, etc.), or it could also be obtained from empirical consideration for a particular sample. In case of well-logging, certain information of the formation and downhole fluids (crude oil, mud, water, etc.) could be known for the well, formation, or the region (basin) before the logging experiment. For example, if a formation is known to lack gas, then the signal area corresponding to gas can be removed from the mask to further reduce the inversion map, thereby making the computation of the inversion easier.

These map masks highlight the few regions in the T1-T2 map (or D-T2, or other maps of the MD experiments) where the elements of the T1T2 distribution are allowed to non-zero in the inversion. The elements outside the mask map are set to substantially zero and, as such, will not participate in the inversion calculation. Using Equation 18 and 19 as an example, assuming F_12 and F_13 are not in the mask and thus excluded from the inversion, the new distribution $F_m$ (masked distribution) is then:

$$F_m = \begin{bmatrix} F_{1,1} & 0 & 0 \\ F_{2,1} & F_{2,2} & F_{2,3} \\ F_{3,1} & F_{3,2} & F_{3,3} \end{bmatrix}, \quad (21)$$

and the corresponding 1D form, $\overline{F}_m$, is then $$\overline{F}_m = \begin{pmatrix} F_{1,1} \\ F_{2,1} \\ F_{3,1} \\ 0 \\ F_{2,2} \\ F_{3,2} \\ 0 \\ F_{2,3} \\ F_{3,3} \end{pmatrix}, \quad (22)$$

The map mask ($F_{mask}$) can be defined as with the same size of the matrix F, the allowed elements are valued 1, and the excluded elements are 0. The masked distribution can be obtained by element-wise multiplication of F and $F_{mask}$, $$F_m = F * F_{mask}, \quad (23)$$

where the "*" indicates the element-wise multiplication.

These mask regions can be rectangular, square, circular, or of any other shapes, may contains one or multiple points. The regions may be interconnected or disconnected. That is, one mask may be continuous or discontinuous, and further, may cover multiple discrete regions within a map. The regions can be defined by mathematical equations, such as T1>0.1, T2<1, or they could be hand-drawn similar to a painting software. Further, the map mask may be chosen based on other data. For example, the map mask could be derived from the T1T2 map of an oil-shale sample (FIG. 3) by selecting (or allowing) those elements whose value is larger than a certain threshold (e.g., 1%, 2%, or 5%) of the maximum signal of the T1T2 map.

The map mask can be used in combination with the NMR acquisition parameters based on the knowledge of the mask. That is, in certain embodiments where a defined mask will be used on the data, then the NMR acquisition parameters than are selected for a log may depend the defined mask. Using T1-T2 experiment as an example, a mask 346 that includes multiple regions may be implemented—(1) one with highly correlated T1T2 (T2>0.1 s) and another (2) with a large T1, T2 range (T1 ranges 0.001 to 0.1, and T2 ranges 0.001 to 0.1 s). Since the signal in region 1 shows correlated T1 and T2, measurement of T2 by the CPMG train is sufficient to define it. For second region, however, it may be suitable to use more independent T1 measurements. As a result, the design of the experiment does not have to use the conventional parameters as outlined in Table 1. Instead, the WT may focus on the second region that is T1<0.1 s, and thus shorter WT and faster logging.

TABLE 2

WT and echo spacing parameters for a T1T2 experiment.

| Pulse Sequence Parameter | |
|---|---|
| Wait Time, WT (ms) | 1, 3, 10, 30, 100, 3000 |
| Echo Spacing (ms) | 0.2 |

The techniques of this disclosure may not use as many WT and thus accelerates the measurement. This is particularly important for well-logging experiment to reduce the total experimental time and increase logging speed. In practical NMR well-logging experiments, many parameters can be varied, such as echo spacing, number of repeats, and number of echoes to acquire for each WT, etc. Table 3 is an example pulse sequence for the downhole NMR tool 12.

TABLE 3

T1-T2 pulse sequence parameters for downhole NMR tool.

| Pulse Sequence Parameter | Short-$T_1$ Sequence |
|---|---|
| Number of Measurements | 6 |
| Wait Time (ms) | 1, 3, 10, 30, 100, 3000 |
| Echo Spacing (ms) | 0.28, 0.28, 0.2, 0.2, 0.2, 0.2 |
| Number of Repeats | 50, 50, 30, 10, 4, 1 |
| Number of Echoes | 20, 20, 50, 100, 300, 1800 |

Figure 19:
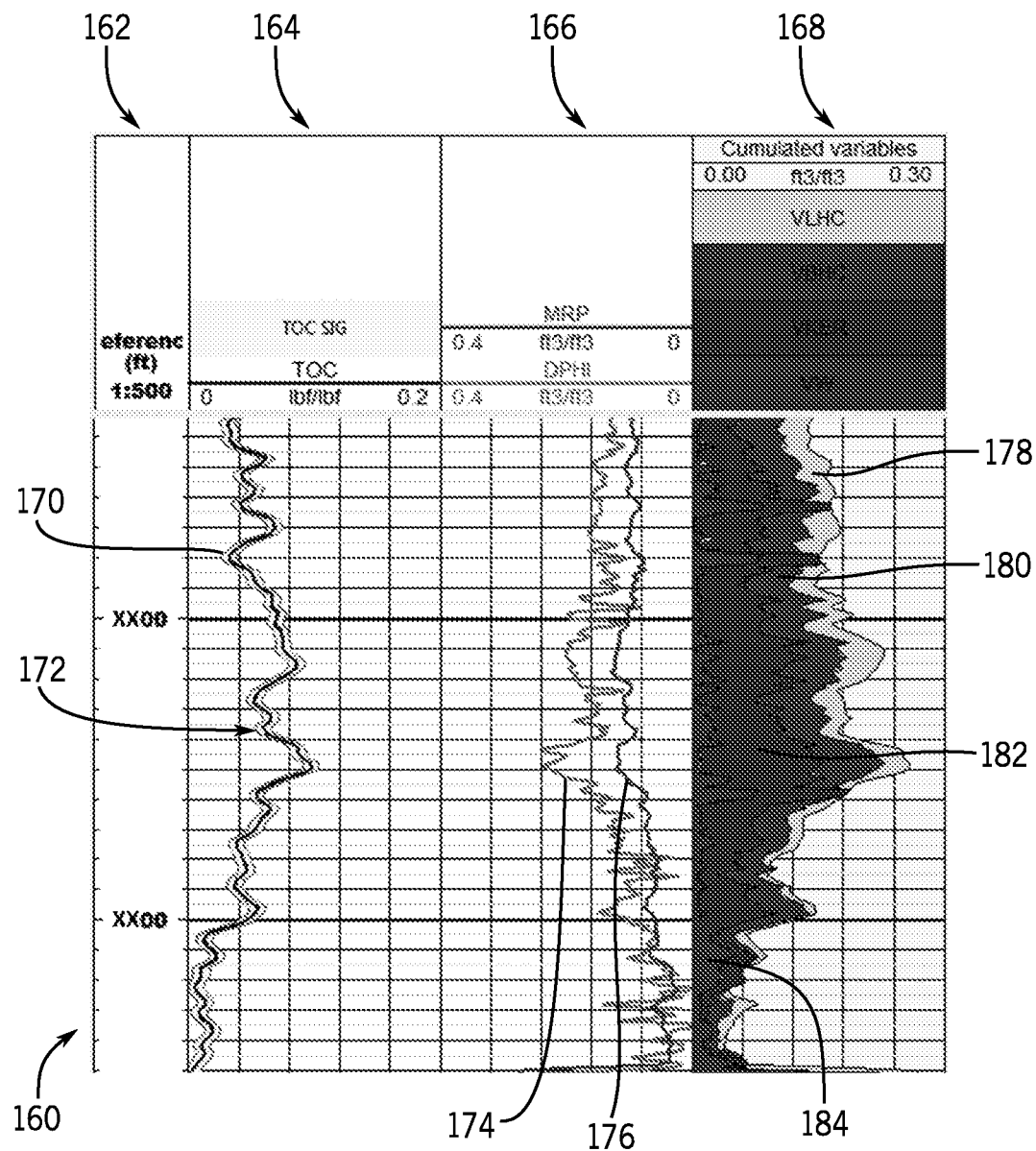
FIG. 19 is a first example NMR well log that may be obtained more quickly using the systems and methods of this disclosure.

FIG. 19 is an example of a well log 160 that may provide a visualization of properties obtained using NMR measurements obtained in a rapid manner in accordance with the systems and methods discussed above. The well log 160 includes four tracks: 162, 164, 166, and 168. The first track 164 represents well depth in units of feet. The second track 162 includes total organic carbon (TOC) 170 and a measurement of its uncertainty (TOC$_{SIG}$) 172. The third track 164 includes density porosity 174 alongside NMR porosity (MRP) 176. The fourth track 166 includes a volume fraction of light hydrocarbon 178, a volume fraction of bitumen 180, a volume fraction of kerogen 182, and a volume fraction of water 184. By presenting the identified underlying features in a visualization such as this, a human operator may be able to effectively make decisions relating to the management and/or operation of the well.

Figure 20:
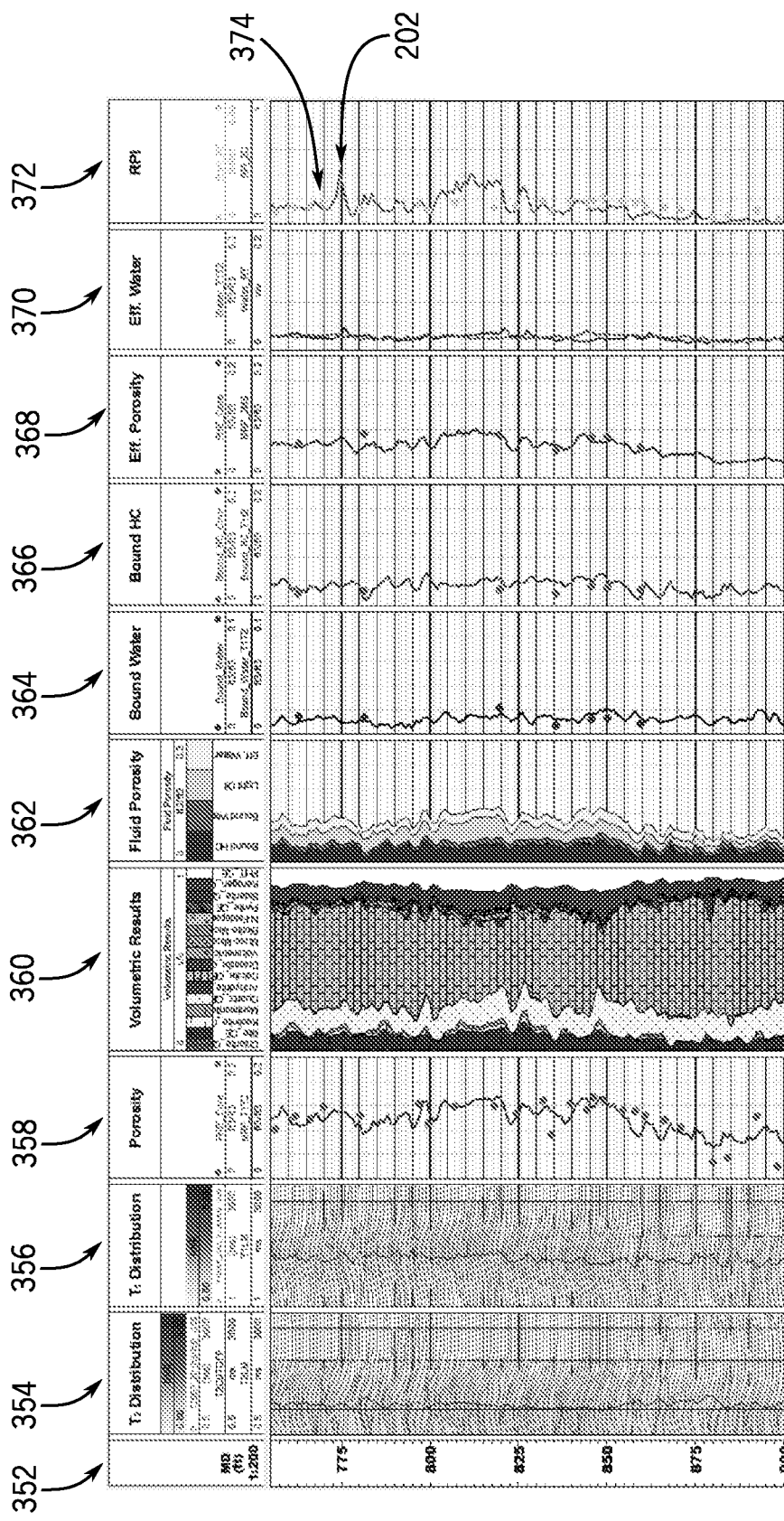
FIG. 20 is a second example NMR well log that may be obtained more quickly using the systems and methods of this disclosure.

FIG. 20 provides an example well log 350 that may include a number of tracks including an RPI value determined based on NMR measurements obtained rapidly in accordance with this disclosure. The well log 350 includes several tracks 352, 354, 356, 358, 360, 362, 364, 366, 368, 370, and 372. These tracks are intended to represent the type of information that may appear in a well log, and these tracks are not meant to be exhaustive. Indeed, more or fewer tracks may be present in any actual well log that is developed in accordance with the workflow of this disclosure. Returning to the example well log 350 of FIG. 15, the tracks may present the following information:

Track 352: depth track.

Track 354: $T_2$ distribution from 2D NMR $T_1$-$T_2$ log with $T_2$LM and $T_2$ cutoff of 3.0 ms to separate bound and effective porosities.

Track 356: $T_1$ distribution from 2D NMR $T_1$-$T_2$ log with $T_1$LM.

Track 358: Porosity from 2D NMR log in comparison to the porosity from core data.

Track 360: Volumetric results of mineralogy and fluids from formation evaluation using spectroscopy and 2D NMR logs.

Track 362: Fluid porosity logs from 2D NMR $T_1$-$T_2$ log using the cutoffs displayed in FIG. 3(c).

Track 364: Clay-bound water porosity from 2D NMR log in comparison to that from core data.

Track 366: Bound hydrocarbon porosity from 2D NMR log in comparison to that from core data.

Track 368: Effective porosity from 2D NMR log using $T_2$ cutoff of 3.0 ms in comparison to that from core data.

Track 370: Effective water porosity from 2D NMR log in comparison to the effective water porosity calculated from resistivity.

Track 372: Calculated RPI 202 (line) from the workflow 200 in comparison to a carbon weight fraction 374 (dots) of producible hydrocarbon calculated from the core data.

Indeed, as may be seen in track 372, the RPI 202 calculated using the multi-dimensional NMR measurements is very well correlated to the core-sample-based measure of carbon weight fraction 374. This suggests that the RPI 202 may serve as a highly valuable addition or alternative to a core sample, since the RPI 202 can be calculated using downhole measurements that might more accurately capture the state of the downhole fluids in the downhole environment. Having generated and output the RPI 202 onto a well log such as the well log 350, an operator or other decision-maker may more effectively make production and recovery decisions tailored to the conditions of the geological formation 14.

The specific embodiments described above have been shown by way of example, and it should be understood that these embodiments may be susceptible to various modifications and alternative forms. It should be further understood that the claims are not intended to be limited to the particular forms disclosed, but rather to cover modifications, equivalents, and alternatives falling within the spirit and scope of this disclosure.

The invention claimed is:

1. A method comprising:
obtaining, using one or more downhole well-logging tools, one or more nuclear magnetic resonance measurements from a geological formation, wherein each of the one or more nuclear magnetic resonance measurements comprises a respective data, wherein the respective data includes amplitudes of one or more of T1 relaxation time, T2 relaxation time, or molecular diffusion;
obtaining standard kernel based at least in part on a known sensitivity of the one or more nuclear magnetic resonance measurements;
applying a mask to the one or more nuclear magnetic resonance measurements, the standard kernel, or both, to generate masked data, wherein the mask is applied at least in part based on one or more known ratios of two or more of T1 relaxation time, T2 relaxation time, or molecular diffusion;
inverting the masked data; and
determining a distribution function using the inverted masked data, wherein the distribution function indicates a presence or absence of certain components of geological formation.

2. The method of claim 1, wherein the mask is referenced from memory of a computing device.

3. The method of claim 1, wherein the mask is defined based at least in part on mathematical equations or a shape relating the one or more nuclear magnetic resonance measurements to one another, wherein the mask is configured to exclude part of the one or more nuclear magnetic resonance measurements and part of the standard kernel.

4. The method of claim 1, wherein the one or more nuclear magnetic resonance measurements are obtained based at least in part on data acquisition parameters relating to the mask.

5. The method of claim 1, wherein a kernel data is a modified kernel, wherein the modified kernel is based at least in part on a longitudinal magnetization within a detector section of the one or more downhole well-logging tools and the standard kernel.

6. The method of claim 1, wherein the mask is determined based at least in part on a known composition of the geological formation.

7. The method of claim 1, wherein the one or more nuclear magnetic resonance measurements comprise a two-dimensional nuclear magnetic resonance measurement of T1 and T2.

8. The method of claim 1, wherein the one or more nuclear magnetic measurements are obtained from a moving one or more downhole well-logging tools.

9. An article of manufacture comprising tangible, non-transitory, machine-readable media comprising instructions that, when executed by a processor, cause the processor to:
obtain, using one or more downhole well-logging tools, one or more nuclear magnetic resonance measurements from a geological formation, wherein each of the one or more nuclear magnetic resonance measurements comprises a respective data, wherein the respective data includes amplitudes of one or more of T1 relaxation time, T2 relaxation time, or molecular diffusion;
determine modified kernel relating to the one or more downhole well-logging tools, wherein the modified kernel is based at least in part on a sensitivity of the one or more nuclear magnetic resonance measurements;
apply a mask to the respective data of the one or more nuclear magnetic resonance measurements to generate masked data, wherein the mask is applied at least in part based on one or more known ratios of two or more of a T1 relaxation time, T2 relaxation time, or molecular diffusion;
invert the masked data to generate inverted masked data, using the modified kernel; and
determine a distribution function using the inverted masked data.

10. The article of manufacture of claim 9, wherein the modified kernel of the one or more downhole well-logging tools relates to a moving well-logging tool.

11. The article of manufacture of claim 9, wherein the one or more nuclear magnetic resonance measurements comprise a multi-dimensional nuclear magnetic resonance measurement comprising at least T1 and T2.

12. The article of manufacture of claim 9, wherein the one or more nuclear magnetic resonance measurements comprises a multi-dimensional nuclear magnetic resonance measurement comprising at least diffusion (D) and T2.

13. The article of manufacture of claim 9, wherein the mask corresponds to the respective data indicative of a presence of water, gas, oil, bitumen, or any combination thereof.

14. The article of manufacture of claim 9, wherein the mask is drawn by an operator.

15. A system comprising:
  a downhole well-logging tool configured to obtain one or more nuclear magnetic resonance measurements from a geological formation; and
  a data processing system comprising a processor, wherein the downhole well-logging tool is configured to receive the one or more nuclear magnetic resonance measurements, and wherein the processor is configured to:
    determine a kernel related to the downhole well-logging tool, wherein the kernel is based at least in part on a sensitivity of the one or more nuclear magnetic resonance measurements;
    apply a mask to the one or more nuclear magnetic resonance measurements to generate masked data, wherein the mask is applied at least in part based on one or more known ratios of two or more of T1 relaxation time, T2 relaxation time, or molecular diffusion;
    invert the masked data using the kernel to generated inverted masked data; and
    determine a distribution function using the inverted masked data that represents a composition of the geological formation.

16. The system of claim 15, wherein the kernel is also based at least in part on the profile of the longitudinal magnetization within a region of a detector of the downhole well-logging tool.

* * * * *